United States Patent
Chang et al.

(10) Patent No.: US 11,024,774 B2
(45) Date of Patent: Jun. 1, 2021

(54) DISPLAY DEVICE REFLECTOR HAVING IMPROVED REFLECTIVITY

(71) Applicant: Taiwan Semiconductor Manufacturing Co., Ltd., Hsin-Chu (TW)

(72) Inventors: Yao-Wen Chang, Taipei (TW); Tzu-Chung Tsai, Hsinchu County (TW); Yen-Chang Chu, Tainan (TW); Chia-Hua Lin, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/601,822

(22) Filed: Oct. 15, 2019

(65) Prior Publication Data

US 2021/0111312 A1    Apr. 15, 2021

(51) Int. Cl.
*H01L 33/40* (2010.01)
*H01L 51/52* (2006.01)

(52) U.S. Cl.
CPC ........ *H01L 33/405* (2013.01); *H01L 51/5271* (2013.01)

(58) Field of Classification Search
None
See application file for complete search history.

(56) References Cited

U.S. PATENT DOCUMENTS

| 6,166,792 A | 12/2000 | Miyawaki et al. |
|---|---|---|
| 2005/0224789 A1 | 10/2005 | Seo et al. |
| 2007/0108446 A1* | 5/2007 | Akimoto ............. H01L 29/4908 257/61 |
| 2015/0041765 A1 | 2/2015 | Ahn et al. |
| 2016/0133878 A1* | 5/2016 | Uesaka ............... H01L 51/5218 257/40 |
| 2019/0198819 A1 | 6/2019 | Shin et al. |

FOREIGN PATENT DOCUMENTS

KR    20090059629 A    6/2009

OTHER PUBLICATIONS

Jorcin et al. "Galvanic Coupling Between Pure Copper and Pure Aluminum Experimental Approach and Mathematical Model." Journal of the Electrochemical Society, 155 (1) C46-C51 (2008), published on Nov. 13, 2007.

* cited by examiner

*Primary Examiner* — Nicholas J Tobergte
*Assistant Examiner* — Kien C Ly
(74) *Attorney, Agent, or Firm* — Eschweiler & Potashnik, LLC

(57) ABSTRACT

Various embodiments of the present disclosure are directed towards a display device. The display device includes an isolation structure disposed over a semiconductor substrate. An electrode is disposed at least partially over the isolation structure. A light-emitting structure is disposed over the electrode. A conductive reflector is disposed below the isolation structure and electrically coupled to the electrode. The conductive reflector is disposed at least partially between sidewalls of the light-emitting structure. The conductive reflector comprises a non-metal-doped aluminum material.

20 Claims, 12 Drawing Sheets

DISPLAY DEVICE REFLECTOR HAVING IMPROVED REFLECTIVITY

BACKGROUND

Many modern day electronic devices, such as televisions and cellular devices, use image display devices to convert digital data into optical images. To achieve this, the image display device may comprise an array of pixel regions. Each pixel region may have a light-emitting structure and may be coupled to a semiconductor device. The semiconductor device may selectively apply an electrical signal (e.g., a voltage) to the light-emitting structure. Upon application of the electrical signal, the light-emitting structure may emit an optical signal (e.g., light). The light-emitting structure may, for example, be an organic light emitting diode (OLED) or some other suitable light emitting device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
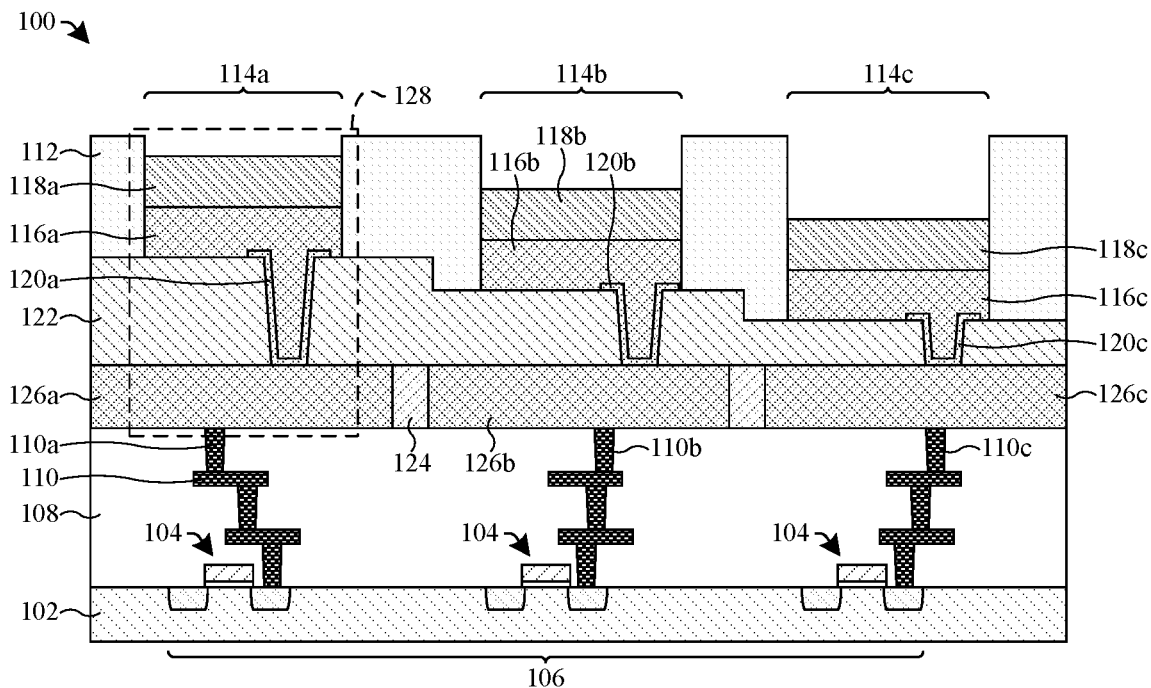
FIG. 1 illustrates a cross-sectional view of some embodiments of a display device having a conductive reflector with improved reflectivity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a display device comprises an array of pixel regions. Each pixel region comprises a conductive reflector, an electrode disposed over the conductive reflector, and a light-emitting structure disposed over the electrode. The electrode is electrically coupled to the conductive reflector and the light-emitting structure. Further, the electrode is configured to allow light (e.g., visible light) to pass through the electrode to the conductive reflector (e.g., due to a thickness of the electrode, a chemical composition of the electrode, etc.).

During operation of one of the pixel regions of the display device, an electrical signal (e.g., a voltage) is applied to the electrode from circuitry coupled to the conductive reflector. The electrical signal causes light to be produced at an interface between the light-emitting structure and the electrode (e.g., due to electron-hole recombination). Some of the produced light passes through the electrode and is reflected by the conductive reflector back toward the light-emitting structure. The light reflected back toward the light-emitting structure combines with some other light produced by the light-emitting structure, and due to constructive and/or deconstructive interference, light having a specific wavelength is emitted from the pixel region. For example, light having a first wavelength (e.g., red light) may be emitted from the pixel region due to the light-emitting structure being spaced a first distance from the conductive reflector, or light having a second wavelength (e.g., green light) may be emitted from the pixel region due to the light-emitting structure being spaced a second distance from the conductive reflector different than the first distance.

Typically, the conductive reflector is made of aluminum-copper (Al—Cu). During formation of the display device, the Al—Cu reflector is often exposed to one or more processing fluids (e.g., etch residue removers, photoresist strippers, deionized water, etc.). When the Al—Cu reflector is exposed to the one or more processing fluids, galvanic corrosion of the Al—Cu reflector may occur causing pitting of the Al—Cu reflector (e.g., due to aluminum and copper having a relatively large difference in the "Anodic Index"). In some embodiments, the galvanic corrosion of the Al—Cu reflector may be induced due to the one or more processing fluids having a relatively high water content (e.g., greater than 20%) and/or the one or more processing fluids having a processing element (e.g., fluorine (F)) that acts as a catalyst. The pitting of the Al—Cu reflector may negatively impact the reflectivity of the Al—Cu reflector (e.g., due to the pitting increasing the surface roughness of an upper surface of the Al—Cu reflector). Accordingly, performance of the display device may be negatively affected (e.g., reduced light emission, reduced color accuracy, etc.).

Various embodiments of the present application are directed toward a display device having a reflector with improved reflectivity. The display device comprises an isolation structure disposed over a semiconductor substrate. An electrode is at least partially disposed over the isolation structure. The electrode is configured to allow light to pass through the electrode. A light-emitting structure is disposed over the electrode. A conductive reflector is disposed below the isolation structure and the electrode. The conductive reflector is disposed at least partially between sidewalls of the light-emitting structure and at least partially between sidewalls of the electrode. The conductive reflector comprises a non-metal-doped aluminum material. The non-metal-doped aluminum material is resistant to galvanic corrosion (e.g., does not undergo galvanic corrosion).

Because the conductive reflector is disposed at least partially between sidewalls of the light-emitting structure, the conductive reflector can reflect light emitted toward the conductive reflector by the light-emitting structure back toward the light-emitting structure. Because the non-metal-doped aluminum material is resistant to galvanic corrosion, the conductive reflector may not undergo galvanic corrosion during the formation of the display device. Because the conductive reflector may not undergo galvanic corrosion, the conductive reflector may not be pitted (e.g., undergo pitting corrosion). Because the conductive reflector may not be pitted, the conductive reflector may have improved reflectivity over a conductive reflector made of Al—Cu (e.g., due to an upper surface of the conductive reflector having a lower surface roughness than an upper surface of the Al—Cu reflector). Accordingly, performance of the display device may be improved over a display device having the conductive reflector made of Al—Cu (e.g., greater light emission, improved color accuracy, etc.).

FIG. 1 illustrates a cross-sectional view of some embodiments of a display device 100 having a conductive reflector with improved reflectivity.

As shown in FIG. 1, the display device 100 comprises a semiconductor substrate 102. The semiconductor substrate 102 may comprise any type of semiconductor body (e.g., monocrystalline silicon/CMOS bulk, silicon-germanium (SiGe), silicon on insulator (SOI), etc.). One or more semiconductor devices 104 may be disposed on/in the semiconductor substrate 102. The one or more semiconductor devices 104 may be or comprise, for example, metal-oxide-semiconductor (MOS) field-effect transistors (FETs), some other MOS devices, or some other semiconductor devices. In some embodiments, the one or more semiconductor devices 104 may be part of a control circuit 106.

An interlayer dielectric (ILD) structure 108 is disposed over the semiconductor substrate 102 and the one or more semiconductor devices 104. An interconnect structure 110 (e.g., copper interconnect) is embedded in the ILD structure 108. The interconnect structure 110 comprises a plurality of conductive features (e.g., metal lines, metal vias, metal contacts, etc.). In some embodiments, the ILD structure 108 comprises one or more stacked ILD layers, which may respectively comprise a low-k dielectric (e.g., a dielectric material with a dielectric constant less than about 3.9), an oxide (e.g., silicon dioxide ($SiO_2$)), or the like. In further embodiments, the interconnect structure 110 may comprise, for example, copper (Cu), aluminum (Al), tungsten (W), some other conductive material, or a combination of the foregoing.

A first dielectric grid 112 is disposed over the ILD structure 108 and the interconnect structure 110. In some embodiments, the first dielectric grid 112 may have an upper surface that is substantially planar. In further embodiments, the first dielectric grid 112 comprises one or more stacked dielectric layers, which may respectively comprise an oxide (e.g., $SiO_2$), a nitride (e.g., silicon nitride (SiN)), an oxy-nitride (e.g., silicon oxy-nitride ($SiO_XN_Y$)), or the like.

A plurality of pixel regions 114a-c are disposed over the interconnect structure 110 and at least partially in the first dielectric grid 112. For example, a first pixel region 114a, a second pixel region 114b, and a third pixel region 114c are disposed over the interconnect structure 110 and at least partially in the first dielectric grid 112. In some embodiments, the plurality of pixel regions 114a-c are disposed in an array comprising rows and columns. In further embodiments, some of the plurality of pixel regions 114a-c may span multiple rows or columns.

The pixel regions 114a-c comprise a plurality of electrodes 116a-c, respectively. For example, the first pixel region 114a comprises a first electrode 116a, the second pixel region 114b comprises a second electrode 116b, and the third pixel region 114c comprises a third electrode 116c. In some embodiments, the electrodes 116a-c are configured to allow light (e.g., visible light) to pass through the electrodes 116a-c (e.g., due to a thickness of the electrode, a chemical composition of the electrode, etc.).

Further, the pixel regions 114a-c comprise light-emitting structures 118a-c, respectively. For example, the first pixel region 114a comprises a first light-emitting structure 118a, the second pixel region 114b comprises a second light-emitting structure 118b, and the third pixel region 114c comprises a third light-emitting structure 118c. The light-emitting structures 118a-c are disposed over the electrodes 116a-c, respectively. The electrodes 116a-c are electrically coupled to the light-emitting structures 118a-c, respectively. In some embodiments, the electrodes 116a-c contact the light-emitting structures 118a-c, respectively.

In some embodiments, the pixel regions 114a-c may comprise a plurality of via structures 120a-c, respectively. For example, the first pixel region 114a comprises a first via structure 120a, the second pixel region 114b comprises a second via structure 120b, and the third pixel region 114c comprises a third via structure 120c. The via structures 120a-c may line a portion of a lower surface of the electrodes 116a-c, respectively. The via structures 120a-c are electrically conductive and are electrically coupled to the electrodes 116a-c, respectively.

An isolation structure 122 is disposed between the interconnect structure 110 and the first dielectric grid 112. In some embodiments, the isolation structure 122 has varying thicknesses. For example, a first portion of the isolation structure 122 is disposed directly beneath the first light-emitting structure 118a, a second portion of the isolation structure 122 is disposed directly beneath the second light-emitting structure 118b, and a third portion of the isolation structure 122 is disposed directly beneath the third light-emitting structure 118c. The first portion of the isolation structure 122 has a first thickness, the second portion of the isolation structure 122 has a second thickness different than (e.g., less than) the first distance, and the third portion of the isolation structure 122 has a third thickness different than (e.g., less than) both the first thickness and the second thickness. In further embodiments, the isolation structure 122 comprises one or more stacked dielectric layers, which may respectively comprise an oxide (e.g., $SiO_2$), a low temperature oxide (e.g., low temperature $SiO_2$), a nitride (e.g., SiN), an oxy-nitride (e.g., $SiO_XN_Y$), or the like.

A second dielectric grid 124 is disposed between the interconnect structure 110 and the isolation structure 122. In some embodiments, one or more portions of the first dielectric grid 112 directly overlie one or more portions of the second dielectric grid 124, respectively. For example, a first portion of the first dielectric grid 112 is disposed between the first light-emitting structure 118a and the second light-emitting structure 118b, and the first portion of the first dielectric grid 112 may directly overlie a first portion of the second dielectric grid 124. In further embodiments, the second dielectric grid 124 comprises one or more stacked dielectric layers, which may respectively comprise an oxide (e.g., $SiO_2$), undoped silicate glass (USG), a nitride (e.g., SiN), an oxy-nitride (e.g., $SiO_XN_Y$), or the like.

A plurality of conductive reflectors 126a-c are disposed between the isolation structure 122 and the interconnect structure 110. For example, a first conductive reflector 126a, a second conductive reflector 126b, and a third conductive reflector 126c are disposed between the isolation structure 122 and the interconnect structure 110. In some embodiments, the plurality of conductive reflectors 126a-c are disposed in the second dielectric grid 124. In such embodiments, the first portion of the second dielectric grid 124 may separate the first conductive reflector 126a from the second conductive reflector 126b. The conductive reflectors 126a-c are electrically coupled to the interconnect structure 110. The conductive reflectors 126a-c are electrically coupled to electrodes 116a-c, respectively.

In some embodiments, the conductive reflectors 126a-c contact the via structures 120a-c, respectively. In further embodiments, the conductive reflectors 126a-c contact upper conductive features 110a-c of the interconnect structure 110, respectively. For example, the first conductive reflector 126a may contact a first upper conductive feature 110a of the interconnect structure 110, the second conductive reflector 126b may contact a second upper conductive feature 110b of the interconnect structure 110, and the third conductive reflector 126c may contact a third upper conductive feature 110c of the interconnect structure 110. In yet further embodiments, the upper conductive features 110a-c may be uppermost conductive features of the interconnect structure 110 (e.g., uppermost vias).

The conductive reflectors 126a-c are disposed at least partially between sidewalls of the light-emitting structures 118a-c, respectively. For example, the first conductive reflector 126a may be disposed at least partially between sidewalls of the first light-emitting structure 118a. Because the conductive reflectors 126a-c are disposed at least partially between sidewalls of the light-emitting structures 118a-c, respectively, light produced by the light-emitting structures 118a-c may be reflected by the conductive reflectors 126a-c back toward the light-emitting structures 118a-c, respectively. For example, because the first conductive reflector 126a is disposed at least partially between the sidewalls of the first light-emitting structure 118a, the first conductive reflector 126a may reflect light produced by the first light-emitting structure 118a back toward the first light-emitting structure 118a. In further embodiments, the sidewalls of the light-emitting structures 118a-c are disposed between sidewalls of the conductive reflectors 126a-c, respectively. For example, the sidewalls of the first light-emitting structure 118a may be disposed between sidewalls of the first conductive reflector 126a. In further embodiments, the conductive reflectors 126a-c are disposed at least partially between sidewalls of the electrodes 116a-c, respectively. For example, the first conductive reflector 126a may be disposed at least partially between sidewalls of the first electrode 116a. In yet further embodiments, the sidewalls of the electrodes 116a-c are disposed between the sidewalls of the conductive reflectors 126a-c, respectively. For example, the sidewalls of the first electrode 116a may be disposed between the sidewalls of the first conductive reflector 126a.

The conductive reflectors 126a-c are electrically coupled to the control circuit 106 (e.g., via the interconnect structure 110). The control circuit 106 is configured to selectively apply electrical signals (e.g., voltages) to the conductive reflectors 126a-c, such that the light-emitting structures 118a-c produce light (e.g., visible light). In some embodiments, the light-emitting structures 118a-c produce light due to the electrical signals causing electron-hole recombination between the electrodes 116a-c and the light-emitting structures 118a-c, respectively. Some of the light produced by the light-emitting structures 118a-c passes through corresponding electrodes, reflects off of the corresponding conductive reflectors, and is reflected back toward the light-emitting structures 118a-c, respectively. The light reflected back toward the light-emitting structures 118a-c combines with some other light produced by the light-emitting structures 118a-c, respectively, and due to constructive and/or deconstructive interference, light having a specific wavelength is emitted from the pixel regions 114a-c, respectively. In further embodiments, the light emitted from the pixel regions 114a-c may be colored light (e.g., red light from the first pixel region 114a, green light from the second pixel region 114b, and blue light from the third pixel region 114c).

For example, the control circuit 106 is electrically coupled to the first conductive reflector 126a. The control circuit is configured to selectively apply an electrical signal (e.g., a voltage) to the first conductive reflector 126a, such that the first light-emitting structure 118a produces light (e.g., due to the electrical signal causing electron-hole recombination between the first electrode 116a and the first light-emitting structure 118a). Some of the light produced by the first light-emitting structure 118a passes through the first electrode 116a, reflects off of the first conductive reflector 126a, and is reflected back toward the first light-emitting structure 118a. The light reflected back toward the first light-emitting structure 118a combines with some other light produced by the first light-emitting structure 118a, and due to constructive and/or deconstructive interference, light having a first wavelength is emitted from the first pixel region 114a. In further embodiments, the light emitted from the first pixel region 114a may be colored light (e.g., red light, blue light, green light, etc.). The first color is dependent on the thickness of the first portion of the isolation structure 122. For example, if the thickness of the first portion of the isolation structure 122 is a first thickness, the colored light may be a first color (e.g., red). On the other hand, if the thickness of the first portion of the isolation structure 122 is a second thickness different than (e.g., less than) the first thickness, the colored light may be a second color (e.g., green, blue, etc.) different than the first color.

In some embodiments, the conductive reflectors 126a-c comprise a non-metal-doped aluminum material. It will be appreciated that the non-metal-doped aluminum material includes aluminum doped with a non-metal (e.g., aluminum-doped zinc oxide, aluminum-doped diamond-like carbon). The non-metal-doped aluminum material is resistant to galvanic corrosion (e.g., does not undergo galvanic corrosion). In further embodiments, the conductive reflectors 126a-c consist essentially of the non-metal-doped aluminum material (e.g., the non-metal-doped aluminum material and any other element(s) that do not materially affect the basic and novel characteristics of the non-metal-doped aluminum material). In further embodiments, the conductive reflectors 126a-c consist of the non-metal-doped aluminum material (e.g., the non-metal-doped aluminum material and impurities ordinarily associated with the non-metal-doped aluminum material). In yet further embodiments, the non-metal-doped aluminum material may be, for example, aluminum (Al), aluminum-silicon (Al—Si), aluminum-doped zinc oxide (Al-doped ZnO), Al-doped diamond-like carbon (Al-doped DLC), or some other non-metal-doped aluminum material. In embodiments in which the non-metal-doped aluminum material is Al—Si, the non-metal-doped aluminum material may comprise less than 1.5 weight percent of silicon in Al—Si.

Because the non-metal-doped aluminum material is resistant to galvanic corrosion, the conductive reflectors 126a-c may not undergo galvanic corrosion during the formation of the display device 100 (e.g., the non-metal-doped aluminum material may not react to cause galvanic corrosion when exposed to one or more processing fluids, such as etch residue removers, photoresist strippers, deionized water, etc.). Because the conductive reflectors 126a-c may not undergo galvanic corrosion, the conductive reflectors 126a-c may not be pitted (e.g., undergo pitting corrosion). Because the conductive reflectors 126a-c may not be pitted, the conductive reflectors 126a-c may have improved reflectivity over other conductive reflectors not comprising the non-metal-doped aluminum material (e.g., aluminum-copper (Al—Cu) reflectors). The conductive reflectors 126a-c may have improved reflectivity over the other conductive reflectors due to the upper surfaces of the conductive reflectors 126a-c having a lower surface roughness than upper surfaces of the other conductive reflectors. Accordingly, performance of the display device 100 may be improved over other display devices having the other conductive reflectors (e.g., greater light emission, improved color accuracy, etc.).

Figure 2:
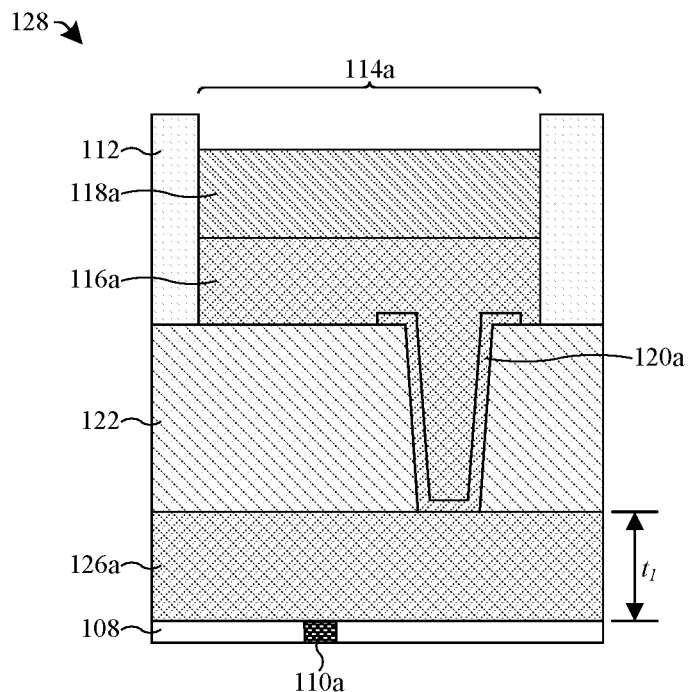
FIG. 2 illustrates a magnified cross-sectional view of some embodiments of an area of the display device of FIG. 1.

FIG. 2 illustrates a magnified cross-sectional view of some embodiments of an area 128 of the display device 100 of FIG. 1. It will be appreciated that, in some embodiments, one or more of the pixel regions 114a-c, one or more of the light-emitting structures 118a-c, one or more of the electrodes 116a-c, one or more of the via structures 120a-c, one or more of the conductive reflectors 126a-c, and/or one or more of the upper conductive features 110a-c may comprise features (e.g., structural features) described below regarding the first pixel region 114a, the first light-emitting structure 118a, the first electrode 116a, the first via structure 120a, the first conductive reflector 126a, and/or the first upper conductive feature 110a, respectively. For example, it will be appreciated that, in some embodiments, the second conductive reflector 126b and/or the third conductive reflector 126c may comprise features described below regarding the first conductive reflector 126a.

As shown in FIG. 2, the first conductive reflector 126a has a first thickness $t_1$. The first thickness $t_1$ may be greater than 1000 angstroms (Å). In some embodiments, an upper surface of the first conductive reflector 126a has a surface roughness less than 100 Å. The first conductive reflector 126a may have a reflectivity greater than 90 percent. In yet further embodiments, the first conductive reflector 126a has a mean of reflection between 400 nanometers (nm) and 650 nm greater than 0.90. More specifically, the first conductive reflector 126a may have a mean of reflection between 400 nm and 650 nm of about 0.913.

In some embodiments, an upper surface of the first upper conductive feature 110a is planar. In further embodiments, an upper surface of the ILD structure 108 is planar. The upper surface of the first upper conductive feature 110a and the upper surface of the ILD structure 108 may be co-planar. In further embodiments, a lower surface of the first conductive reflector 126a contacts the first upper conductive feature 110a and the ILD structure 108. In yet further embodiments, the upper surface of the first conductive reflector 126a contacts the isolation structure 122 and the first via structure 120a.

In some embodiments, the first electrode 116a is at least partially disposed over the isolation structure 122. The first electrode 116a may contact the isolation structure 122. A portion of the first electrode 116a may extend into the isolation structure 122 toward the first conductive reflector 126a. The portion of the first electrode that extends into the isolation structure 122 may have angled sidewalls. In further embodiments, the first electrode 116a may contact the first conductive reflector 126a. An upper surface of the first electrode 116a may be planar. In yet further embodiments, the upper surface of the first electrode 116a may be disposed between an upper surface of the first dielectric grid 112 and a lower surface of the first dielectric grid 112.

In some embodiments, the first electrode 116a is configured to allow visible light to pass through the first electrode 116a (e.g., visible light produced by the first light-emitting structure 118a). Visible light may be able to pass through the first electrode 116a due to a thickness and/or a chemical composition of the first electrode 116a. In further embodiments, the first electrode 116a may be or comprise, for example, indium tin oxide (ITO), fluorine tin oxide (FTO), some other conductive material, or a combination of the foregoing.

In some embodiments, the first via structure 120a separates the portion of the first electrode 116a that extends into the isolation structure 122 from the isolation structure 122. The first via structure 120a may contact an upper surface of the isolation structure 122. In further embodiments, the first via structure 120a is electrically coupled to the first conductive reflector 126a and the first electrode 116a. The first via structure 120a may contact the first conductive reflector 126a and the first electrode 116a. In further embodiments, the first via structure 120a has angled sidewalls. In yet further embodiments, the first via structure 120a may be or comprise, for example, titanium nitride (TiN), tantalum nitride (TaN), or the like.

In some embodiments, the upper surface of the first light-emitting structure 118a is disposed between the upper surface of the first dielectric grid 112 and the lower surface of the first dielectric grid 112. The first light-emitting structure 118a is disposed at least partially between the sidewalls of the first electrode 116a. In further embodiments, the sidewalls of the first light-emitting structure 118a are aligned with the sidewalls of the first electrode 116a. In yet further embodiments, the first light-emitting structure 118a may be or comprise an organic light emitting diode (OLED), or some other suitable light-emitting device.

Figure 3:
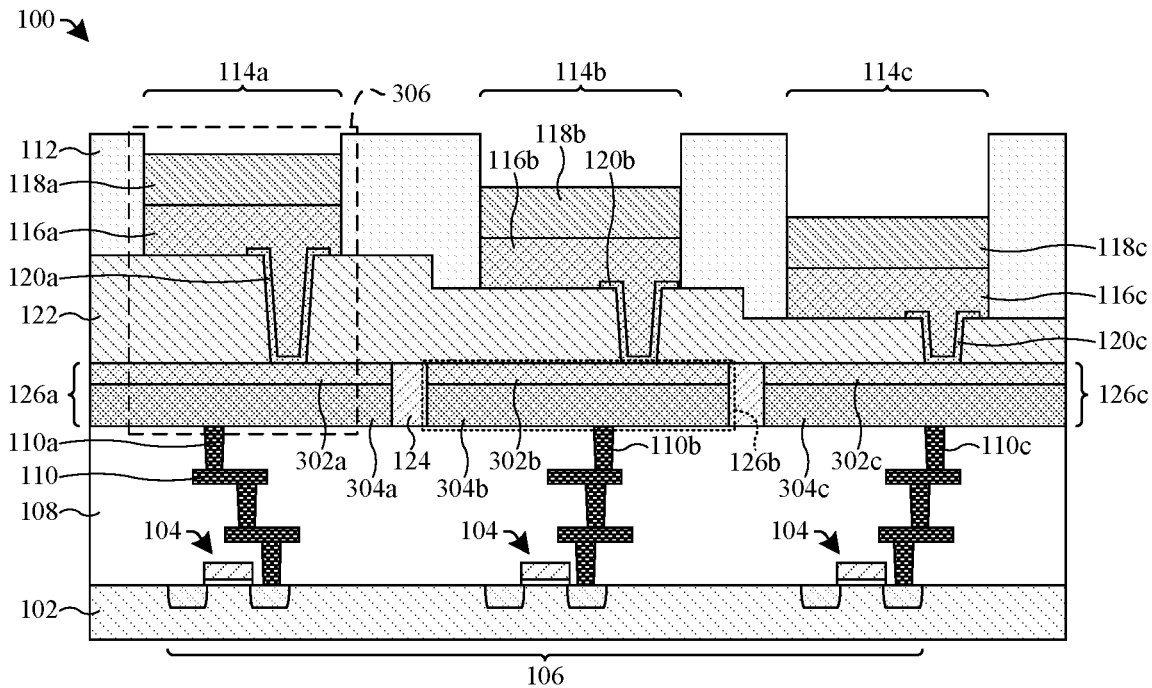
FIG. 3 illustrates a cross-sectional view of some other embodiments of the display device of FIG. 1.

FIG. 3 illustrates a cross-sectional view of some other embodiments of the display device 100 of FIG. 1.

As shown in FIG. 3, the conductive reflectors 126a-c comprise non-metal-doped aluminum structures 302a-c, respectively. For example, the first conductive reflector 126a comprises a first non-metal-doped aluminum structure 302a, the second conductive reflector 126b comprises a second non-metal-doped aluminum structure 302b, and the third conductive reflector 126c comprises a third non-metal-doped aluminum structure 302c. Further, the conductive reflectors 126a-c comprise metal-doped aluminum structures 304a-c, respectively. For example, the first conductive reflector 126a comprises a first metal-doped aluminum structure 304a, the second conductive reflector 126b comprises a second metal-doped aluminum structure 304b, and the third conductive reflector 126c comprises a third metal-doped aluminum structure 304c.

In some embodiments, the metal-doped aluminum structures 304a-c comprise a metal-doped aluminum material. The metal-doped aluminum material is more susceptible to galvanic corrosion than the non-metal-doped aluminum material. In further embodiments, the metal-doped aluminum structures 304a-c consist essentially of the metal-doped aluminum material (e.g., the metal-doped aluminum material and any other element(s) that do not materially affect the basic and novel characteristics of the metal-doped aluminum material). In further embodiments, the metal-doped aluminum structures 304a-c consist of the metal-doped aluminum material (e.g., the metal-doped aluminum material and impurities ordinarily associated with the metal-doped aluminum material). In yet further embodiments, the metal-doped aluminum material may be, for example, aluminum-copper (Al—Cu), aluminum-nickel (Al—Ni), aluminum-titanium (Al—Ti), aluminum-tin-copper (Al—Sn—Cu), or some other metal-doped aluminum material. In embodiments in which the metal-doped aluminum material is Al—Cu, the metal-doped aluminum material may comprise less than 0.5 weight percent of copper in Al—Cu.

The non-metal-doped aluminum structures 302a-c are disposed over the metal-doped aluminum structures 304a-c, respectively. The non-metal-doped aluminum structures 302a-c cover the metal-doped aluminum structures 304a-c, respectively. In some embodiments, the non-metal-doped aluminum structures 302a-c contact the metal-doped aluminum structures 304a-c, respectively. In further embodiments, sidewalls of the non-metal-doped aluminum structures 302a-c are aligned with sidewalls of the metal-doped aluminum structures 304a-c, respectively.

In some embodiments, the non-metal-doped aluminum structures 302a-c comprise the non-metal-doped aluminum material. In further embodiments, the non-metal-doped aluminum structures 302a-c consists essentially of the non-metal-doped aluminum material. In further embodiments, the non-metal-doped aluminum structures 302a-c consists of the non-metal-doped aluminum material.

Because the non-metal-doped aluminum structures 302a-c cover the metal-doped aluminum structures 304a-c, respectively, the non-metal-doped aluminum structures 302a-c protect the metal-doped aluminum structures 304a-c from galvanic corrosion caused during formation of the display device 100 (e.g., due to the non-metal-doped aluminum material being resistant to galvanic corrosion). Because the non-metal-doped aluminum structures 302a-c protect the metal-doped aluminum structures 304a-c from galvanic corrosion, the conductive reflectors 126a-c may not be pitted. Because the conductive reflectors 126a-c may not be pitted, the conductive reflectors 126a-c may have improved reflectivity over other conductive reflectors not comprising a non-metal-doped aluminum material. The conductive reflectors 126a-c may have improved reflectivity over the other conductive reflectors due to upper surfaces of the non-metal-doped aluminum structures 302a-c having a lower surface roughness than upper surfaces of the other conductive reflectors. Accordingly, performance of the display device 100 may be improved over other display devices having the other conductive reflectors.

Figure 4:
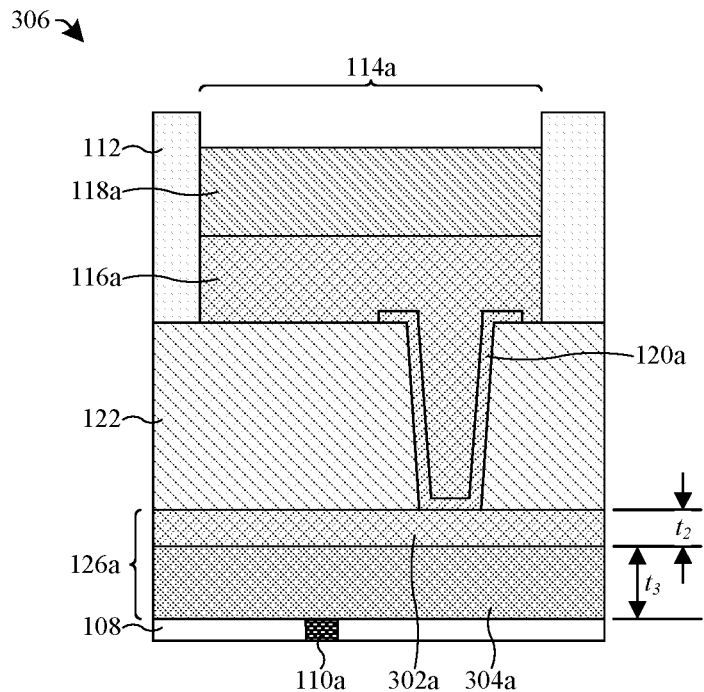
FIG. 4 illustrates a magnified cross-sectional view of some embodiments of an area of the display device of FIG. 3.

FIG. 4 illustrates a magnified cross-sectional view of some embodiments of an area 306 of the display device 100 of FIG. 3. It will be appreciated that, in some embodiments, one or more of the non-metal-doped aluminum structures 302a-c may comprise features (e.g., structural features) described below regarding the first non-metal-doped aluminum structure 302a, and/or one or more of the metal-doped aluminum structures 304a-c may comprise features described below regarding the first metal-doped aluminum structure 304a.

As shown in FIG. 4, the first non-metal-doped aluminum structure 302a has a second thickness $t_2$, and the first metal-doped aluminum structure 304a has a third thickness $t_3$. In some embodiments, a sum of the second thickness $t_2$ and the third thickness $t_3$ is greater than 1000 Å. In further embodiments, the third thickness $t_3$ is at least four times greater than the second thickness $t_2$. In other words, in some embodiments, a ratio of the third thickness $t_3$ to the second thickness $t_2$ is greater than 4:1.

In some embodiments, an upper surface of the first non-metal-doped aluminum structure 302a has a surface roughness less than 100 Å. The first non-metal-doped aluminum structure 302a may have a reflectivity greater than 90 percent. In further embodiments, the first non-metal-doped aluminum structure 302a has a mean of reflection between 400 nm and 650 nm greater than 0.90. More specifically, the first non-metal-doped aluminum structure 302a may have a mean of reflection between 400 nm and 650 nm of about 0.913.

In some embodiments, the first metal-doped aluminum structure 304a is disposed between the interconnect structure 110 and the first non-metal-doped aluminum structure 302a. The first metal-doped aluminum structure 304a may contact the first upper conductive feature 110a and the ILD structure 108. The first non-metal-doped aluminum structure 302a is disposed between the first metal-doped aluminum structure 304a and the first electrode 116a. In further embodiments, an upper surface of the first non-metal-doped aluminum structure 302a contacts the first via structure 120a, the first electrode 116a, and/or the isolation structure 122.

Figure 5:
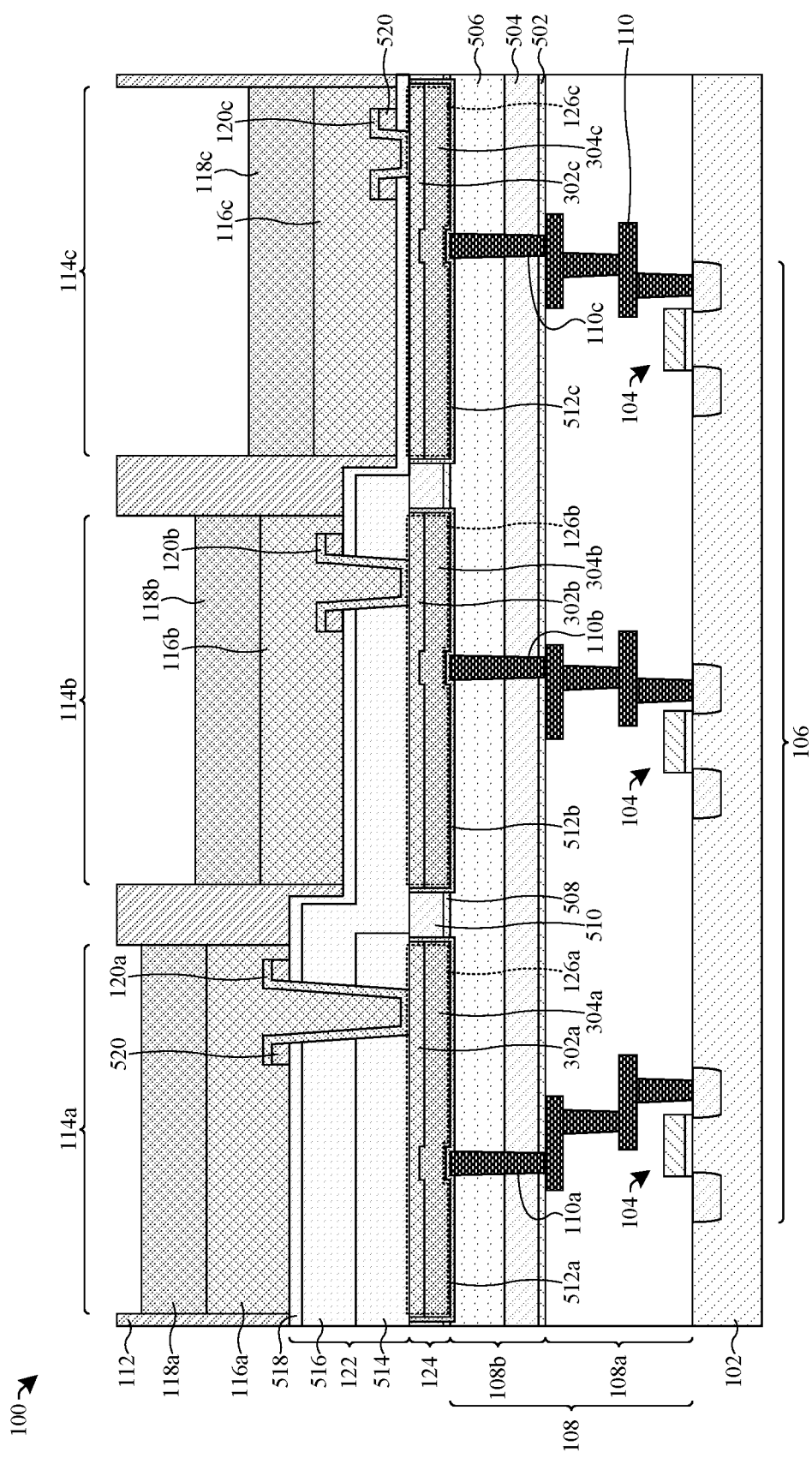
FIG. 5 illustrates a cross-sectional view of some other embodiments of the display device of FIG. 1.

FIG. 5 illustrates a cross-sectional view of some other embodiments of the display device 100 of FIG. 1.

As shown in FIG. 5, the ILD structure 108 comprises a lower ILD structure 108a and an upper ILD structure 108b disposed over the lower ILD structure 108a. In some embodiments, the lower ILD structure 108a comprises one or more stacked ILD layers, which may respectively comprise a low-k dielectric, an oxide (e.g., $SiO_2$), or the like. In further embodiments, the upper conductive features 110a-c are disposed over the lower ILD structure 108a and in the upper ILD structure 108b.

In some embodiments, the upper ILD structure 108b comprises a first dielectric structure 502, a second dielectric structure 504, and a third dielectric structure 506. The first dielectric structure 502 is disposed over the lower ILD structure 108a. The first dielectric structure 502 may comprise, for example, an oxide (e.g., $SiO_2$), a nitride (e.g., SiN), an oxy-nitride (e.g., $SiO_XN_Y$), or the like. The second dielectric structure 504 is disposed over the first dielectric structure 502. The second dielectric structure 504 may comprise, for example, an oxide (e.g., $SiO_2$), a nitride (e.g., SiN), an oxy-nitride (e.g., $SiO_XN_Y$), or the like. In further embodiments, the second dielectric structure 504 may comprise undoped silicate glass (USG). The third dielectric structure 506 is disposed over the second dielectric structure 504. The third dielectric structure 506 may comprise, for example, an oxide (e.g., $SiO_2$), a nitride (e.g., SiN), an oxy-nitride (e.g., $SiO_XN_Y$), or the like. In further embodiments, the first dielectric structure 502 is SiN, the second dielectric structure 504 is USG, and the third dielectric structure 506 is SiN.

In some embodiments, the second dielectric grid 124 comprises a fourth dielectric structure 508 and a fifth dielectric structure 510 disposed over the fourth dielectric structure 508. The fourth dielectric structure 508 may comprise, for example, an oxide (e.g., $SiO_2$), a nitride (e.g., SiN), an oxy-nitride (e.g., $SiO_XN_Y$), or the like. The fifth dielectric structure 510 may comprise, for example, an oxide (e.g., $SiO_2$), a nitride (e.g., SiN), an oxy-nitride (e.g., $SiO_XN_Y$), or the like. In further embodiments, the fifth dielectric structure 510 may comprise USG. In yet further embodiments, the fourth dielectric structure 508 is SiN and the fifth dielectric structure 510 is USG.

In some embodiments, a first plurality of barrier structures 512a-c line the plurality of conductive reflectors 126a-c, respectively. For example, a first barrier structure 512a lines the lower surface and sidewalls of the first conductive reflector 126a, a second barrier structure 512b lines a lower surface and sidewalls of the second conductive reflector 126b, and a third barrier structure 512c lines a lower surface and sidewalls of the third conductive reflector 126c. In some embodiments, the first plurality of barrier structures 512a-c separate the metal-doped aluminum structures 304a-c from the upper conductive features 110a-c, respectively. In further embodiments, upper surfaces of the first plurality of barrier structures 512a-c are co-planar with an upper surface of the fifth dielectric structure 510 and/or co-planar with the upper surface of the non-metal-doped aluminum structures 302a-c. In yet further embodiments, the first plurality of barrier structures 512a-c may comprise, for example, TaN, TiN, or the like.

In some embodiments, the metal-doped aluminum structures 304a-c have first upper surfaces, respectively, and the metal-doped aluminum structures 304a-c have second upper surfaces, respectively. In such embodiments, the second upper surfaces are disposed over the first upper surfaces, respectively. The second upper surfaces are disposed in central regions of the metal-doped aluminum structures 304a-c, respectively. In further embodiments, the second upper surfaces directly overlie the upper conductive features 110a-c, respectively.

In some embodiments, the metal-doped aluminum structures 304a-c have first lower surfaces, respectively, and the metal-doped aluminum structures 304a-c have second lower surfaces. In such embodiments, the second lower surfaces are disposed over the first lower surfaces, respectively. The second lower surfaces are disposed in the central regions of the metal-doped aluminum structures 304a-c, respectively. In further embodiments, the second lower surfaces directly overlie the upper conductive features 110a-c, respectively. In yet further embodiments, the second upper surfaces directly overlie the second lower surfaces, respectively.

In some embodiments, the non-metal-doped aluminum structures 302a-c have third lower surfaces, respectively, and the non-metal-doped aluminum structures 302a-c have fourth lower surfaces, respectively. In such embodiments, the fourth lower surfaces are disposed over the third lower surfaces, respectively. The fourth lower surfaces are disposed in the central regions of the non-metal-doped aluminum structures 302a-c, respectively. In further embodiments, the fourth lower surfaces directly overlie the upper conductive features 110a-c, respectively. In further embodiments, the fourth lower surfaces directly overlie the second upper surfaces, respectively. In yet further embodiments, the non-metal-doped aluminum structures 302a-c have planar upper surfaces that continuously extends between sidewalls of the non-metal-doped aluminum structures 302a-c, respectively. For example, the first non-metal-doped aluminum structure 302a may have a planar upper surface that continuously extends between sidewalls of the first non-metal-doped aluminum structure 302a.

In some embodiments, the isolation structure 122 comprises a sixth dielectric structure 514, a seventh dielectric structure 516, and an eighth dielectric structure 518. The sixth dielectric structure 514, the seventh dielectric structure 516, and the eighth dielectric structure 518 are disposed over the conductive reflectors 126a-c. In some embodiments, the sixth dielectric structure 514 contacts the first conductive reflector 126a. In further embodiments, the seventh dielectric structure 516 covers the sixth dielectric structure 514 and contacts the second conductive reflector 126b. In further embodiments, the eighth dielectric structure 518 covers the seventh dielectric structure 516 and contacts the third conductive reflector 126c. The sixth dielectric structure 514, the seventh dielectric structure 516, and/or the eighth dielectric structure 518 may comprise, for example, an oxide (e.g., $SiO_2$), a low temperature oxide (e.g., low temperature $SiO_2$), a nitride (e.g., SiN), an oxy-nitride (e.g., $SiO_XN_Y$), or the like. In yet further embodiments, the sixth dielectric structure 514, the seventh dielectric structure 516, and the eighth dielectric structure 518 are low temperature oxides.

In some embodiments, a second plurality of barrier structures 520 are disposed over the sixth dielectric structure 514, the seventh dielectric structure 516, and the eighth dielectric structure 518. The second plurality of barrier structures 520 may separate an upper surface of the eighth dielectric structure 518 from lower surfaces of the via structures 120a-c. In further embodiments, the second plurality of barrier structures 520 may comprise, for example, TiN, tungsten carbide (WC), or the like.

FIGS. 6-15 illustrate a series of cross-sectional views of some embodiments for forming a display device 100 having a conductive reflector with improved reflectivity.

Figure 6:
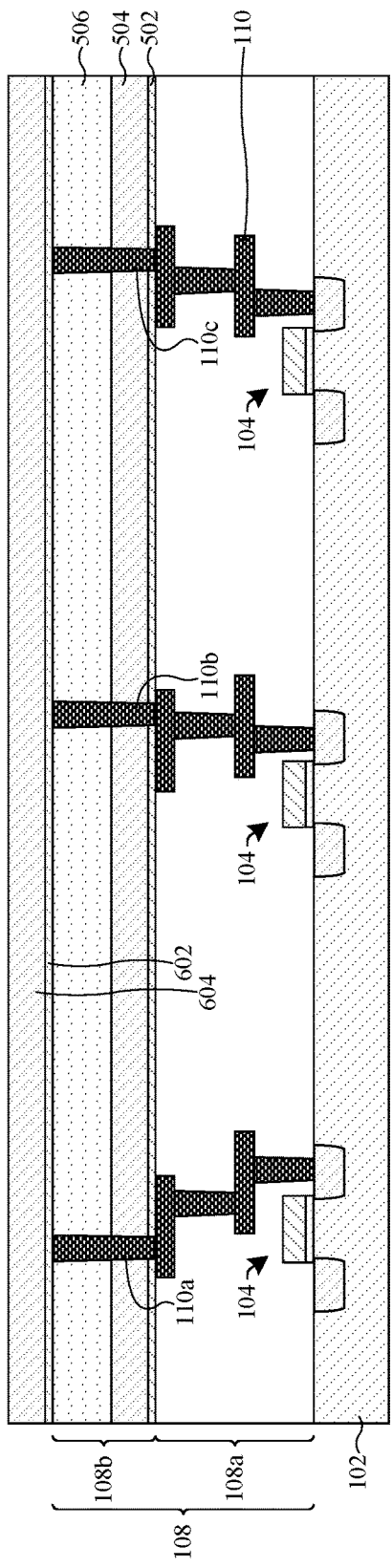
FIGS. 6-15 illustrate a series of cross-sectional views of some embodiments for forming a display device having a conductive reflector with improved reflectivity.

As shown in FIG. 6, an interlayer dielectric (ILD) structure 108 is disposed over a semiconductor substrate 102. An interconnect structure 110 is disposed in the ILD structure 108. The ILD structure 108 comprises a lower ILD structure 108a and an upper ILD structure 108b. The upper ILD structure 108b comprises a first dielectric structure 502, a second dielectric structure 504, and a third dielectric structure 506. Further, upper conductive features 110a-c of the interconnect structure 110 are disposed in the upper ILD structure 108b. Moreover, one or more semiconductor devices 104 are disposed on/in the semiconductor substrate 102. In addition, a fourth dielectric layer 602 is disposed over the third dielectric structure 506, and a fifth dielectric layer 604 is disposed over the fourth dielectric layer 602.

In some embodiments, a method for forming the structure illustrated in FIG. 6 comprises forming the one or more semiconductor devices 104 by forming pairs of source/drain regions in the semiconductor substrate 102 (e.g., via ion implantation). Thereafter, gate dielectrics and gate electrodes are formed over the semiconductor substrate 102 and between the pairs of source/drain regions (e.g., via deposition/growth processes and etching processes). A first ILD layer is then formed over the one or more semiconductor devices 104, and contact openings are formed in the first ILD layer. A conductive material (e.g., W) is formed on the first ILD layer and in the contact openings. Thereafter, a planarization process (e.g., chemical-mechanical polishing (CMP)) is performed into the conductive material to form conductive contacts (e.g., metal contacts) in the first ILD layer.

A second ILD layer is then formed over the first ILD layer and the conductive contacts, and first conductive line trenches are formed in the second ILD layer. A conductive material (e.g., Cu) is formed on the second ILD layer and in the first conductive line trenches. Thereafter, a planarization process (e.g., CMP) is performed into the conductive material to form a conductive line (e.g., metal line) in the second ILD. A third ILD layer is then formed over the second ILD layer and the conductive line, and conductive via openings are formed in the third ILD layer. A conductive material (e.g., Cu) is formed on the third ILD layer and in the conductive via openings. Thereafter, a planarization process (e.g., CMP) is performed into the conductive material to form conductive vias (e.g., metal vias) in the third ILD layer. The above processes for forming the conductive line and the conductive vias may be repeated any number of times to form the lower ILD structure 108a and the portion of the interconnect structure 110 embedded in the lower ILD structure 108a.

A first dielectric layer (not shown) is then formed over the lower ILD structure 108a and the portion of the interconnect structure 110 embedded in the lower ILD structure 108a. A second dielectric layer (not shown) is formed over the first dielectric layer. Thereafter, a third dielectric layer (not shown) is formed over the second dielectric layer. A patterned masking layer (not shown) is then formed on the third dielectric layer. Thereafter, the third dielectric layer, the second dielectric layer, and the first dielectric layer are exposed to an etchant (e.g., wet/dry etchant) to remove unmasked portions of the third dielectric layer, the second dielectric layer, and the first dielectric layer, thereby forming the third dielectric structure 506, second dielectric structure 504, and the first dielectric structure 502. At this point of forming the display device 100, the third dielectric structure 506, the second dielectric structure 504, and the first dielectric structure 502 define a plurality of upper conductive feature openings that extend through the third dielectric structure 506, the second dielectric structure 504, and the first dielectric structure 502 to the portion of the interconnect structure 110 embedded in the lower ILD structure 108a. A conductive material (e.g., Cu) is then formed on the third dielectric structure 506 and in the upper conductive feature openings. Thereafter, a planarization process (e.g., CMP) is performed into the conductive material to form the upper conductive features 110a-c. In some embodiments, the above layers and/or structures may be formed using a deposition or growth process, such as chemical vapor deposition (CVD), physical vapor deposition (PVD), atomic layer deposition (ALD), thermal oxidation, sputtering, electrochemical plating, electroless plating, some other deposition or growth process, or a combination of the foregoing.

The fourth dielectric layer 602 is then formed over the upper conductive features 110a-c and the third dielectric structure 506. The fourth dielectric layer 602 may comprise, for example, an oxide (e.g., $SiO_2$), a nitride (e.g., SiN), an oxy-nitride (e.g., $SiO_XN_Y$), or the like. In further embodiments, the fourth dielectric layer 602 is SiN. The fourth dielectric layer 602 may be formed by depositing the fourth dielectric layer 602 on the upper conductive features 110a-c and the third dielectric structure 506. In yet further embodiments, the first dielectric layer may be deposited by, for example, CVD, PVD, ALD, or the like.

The fifth dielectric layer 604 is then formed over the fourth dielectric layer 602. The fifth dielectric layer 604 may comprise, for example, an oxide (e.g., $SiO_2$), a nitride (e.g., SiN), an oxy-nitride (e.g., $SiO_XN_Y$), or the like. In further embodiments, the fifth dielectric layer 604 is USG. The fifth dielectric layer 604 may be formed by depositing the fifth dielectric layer 604 on the fourth dielectric layer 602. In yet further embodiments, the fifth dielectric layer 604 may be deposited by, for example, CVD, PVD, ALD, or the like.

Figure 7:
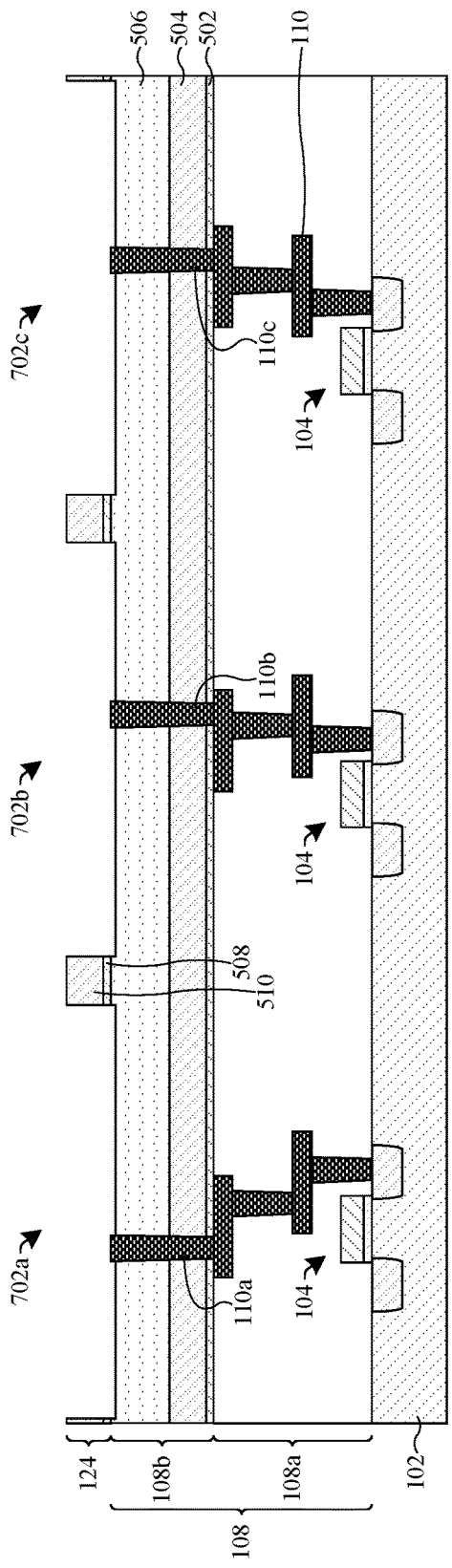

As shown in FIG. 7, a second dielectric grid 124 is formed over the ILD structure 108. The second dielectric grid 124 comprises a fourth dielectric structure 508 and a fifth dielectric structure 510. At this point of forming the display device 100, the second dielectric grid 124 comprises a plurality of openings 702a-c that extend into the fifth dielectric structure 510 and the fourth dielectric structure 508. For example, a first opening 702a, a second opening 702b, and a third opening 702c are formed extending into the fifth dielectric structure 510 and the fourth dielectric structure 508. In some embodiments, first lower surfaces of the openings 702a-c are defined by the third dielectric structure 506. In further embodiments, second lower surfaces of the openings 702a-c are defined by upper surfaces of the upper conductive features 110a-c. The first lower surfaces of the openings 702a-c may be disposed below a lower surface of the fourth dielectric structure 508. The second lower surfaces of the openings 702a-c are disposed above the first lower surfaces of the openings 702a-c, respectively.

In some embodiments, a process for forming the second dielectric grid 124 comprises forming a pattered masking layer (not shown) (e.g., negative/positive photoresist) on the fifth dielectric layer 604 (see, e.g., FIG. 6) (e.g., via a deposition process and photolithography process). Thereafter, the fifth dielectric layer 604 and the fourth dielectric layer 602 are exposed to an etchant to remove unmasked portions of both the fifth dielectric layer 604 and the fourth dielectric layer 602, thereby forming the second dielectric grid 124 (and thus the fifth dielectric structure 510 and the fourth dielectric structure 508). In further embodiments, the third dielectric structure 506 and/or the upper conductive features 110a-c are exposed to the etchant. The etchant may etch the third dielectric structure 506 at a faster rate than the etchant etches the upper conductive features 110a-c. In such embodiments, the etchant may remove a portion of the third dielectric structure 506, such that the upper surfaces of the upper conductive features 110a-c are disposed over the upper surfaces of the third dielectric structure 506.

Figure 8:
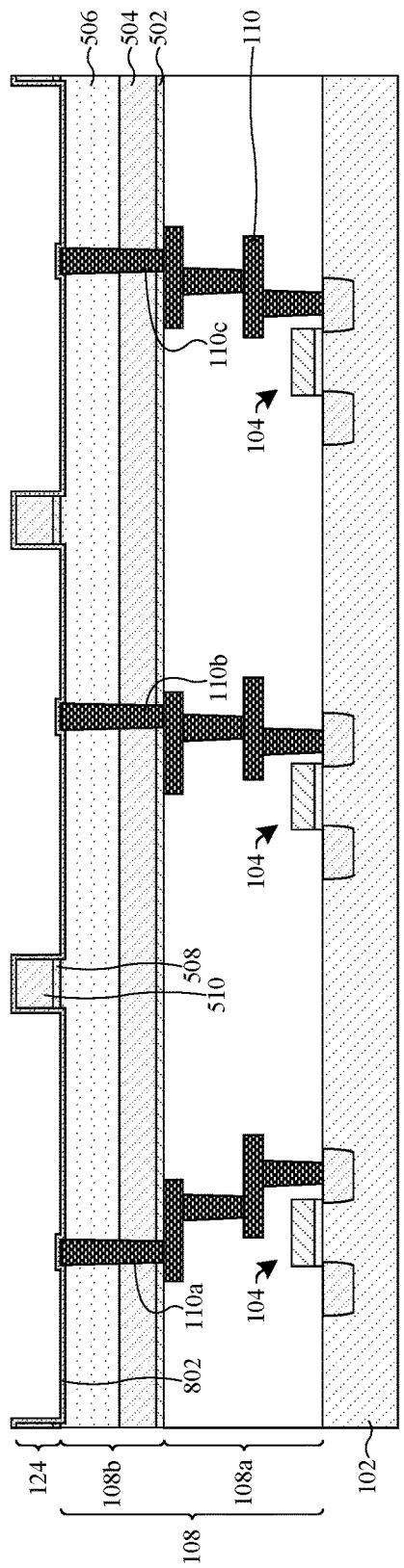

As shown in FIG. 8, a barrier layer 802 is formed over the second dielectric grid 124, the third dielectric structure 506, and the upper conductive features 110a-c. In some embodiments, the barrier layer 802 is formed on the second dielectric grid 124 and lining the openings 702a-c (see, e.g., FIG. 7). The barrier layer 802 may be a conformal layer. In some embodiments, a process for forming the barrier layer 802 comprises depositing the barrier layer 802 on the second dielectric grid 124 and lining the openings 702a-c. The barrier layer 802 may be deposited by, for example, sputtering, CVD, PVD, ALD, some other deposition process, or a combination of the foregoing. The barrier layer 802 may comprise, for example, TaN, TiN, or the like.

Figure 9:
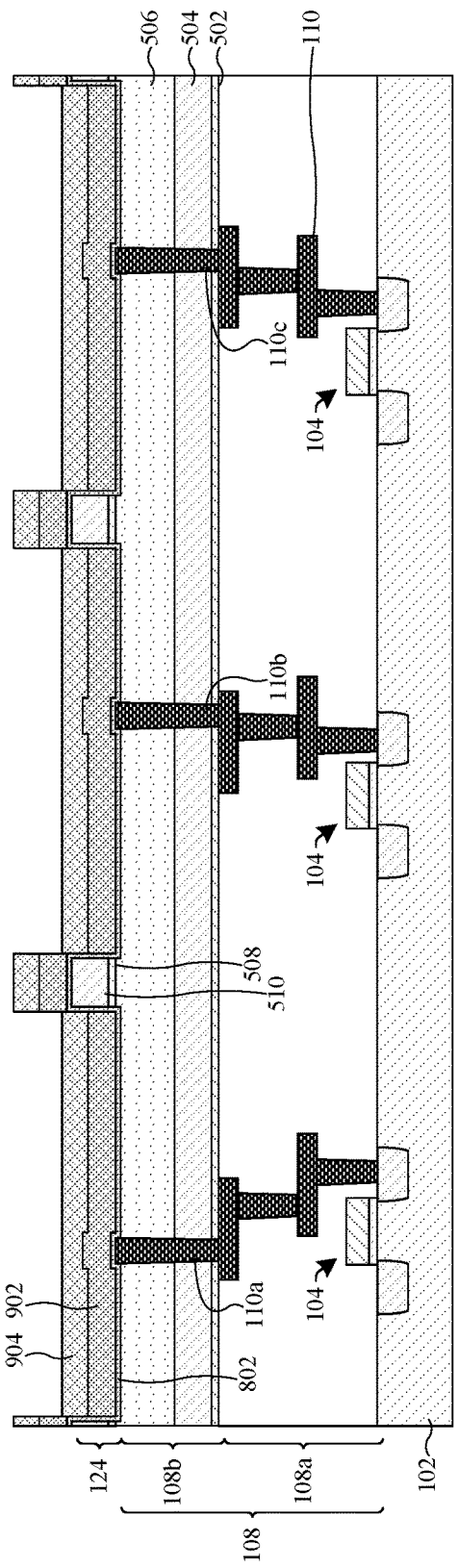

As shown in FIG. 9, a metal-doped aluminum layer 902 is formed over the barrier layer 802, over the second dielectric grid 124, and partially in the openings 702a-c (see, e.g., FIG. 7). In some embodiments, the metal-doped aluminum layer 902 is formed on the barrier layer 802. In further embodiments, a process for forming the metal-doped aluminum layer 902 comprises depositing the metal-doped aluminum layer 902 on the barrier layer 802. The metal-doped aluminum layer 902 may be deposited by, for example, sputtering, CVD, PVD, ALD, some other deposition process, or a combination of the foregoing.

In some embodiments, the metal-doped aluminum layer 902 comprises a metal-doped aluminum material. In further embodiments, the metal-doped aluminum layer 902 consist essentially of the metal-doped aluminum material. In further embodiments, the metal-doped aluminum layer 902 consists of the metal-doped aluminum material. In yet further embodiments, the metal-doped aluminum material may be, for example, Al—Cu, Al—Ni, Al—Ti, Al—Sn—Cu, or some other metal-doped aluminum material. In embodiments in which the metal-doped aluminum material is Al—Cu, the metal-doped aluminum material may comprise less than 0.5 weight percent of copper in Al—Cu.

Also shown in FIG. 9, a non-metal-doped aluminum layer 904 is formed over the metal-doped aluminum layer 902, over the second dielectric grid 124, and at least partially in the openings 702a-c (see, e.g., FIG. 7). In some embodiments, the non-metal-doped aluminum layer 904 comprises a non-metal-doped aluminum material. It will be appreciated that the non-metal-doped aluminum material includes aluminum doped with a non-metal (e.g., aluminum-doped zinc oxide, aluminum-doped diamond-like carbon). The non-metal-doped aluminum material is resistant to galvanic corrosion (e.g., does not undergo galvanic corrosion). The metal-doped aluminum material is more susceptible to galvanic corrosion than the non-metal-doped aluminum material. In further embodiments, the non-metal-doped aluminum layer 904 consists essentially of the non-metal-doped aluminum material. In further embodiments, the non-metal-doped aluminum layer 904 consists of the non-metal-doped aluminum material. In yet further embodiments, the non-metal-doped aluminum material may be, for example, Al, Al—Si, Al-doped ZnO, Al-doped DLC, or some other non-metal-doped aluminum material. In embodiments in which the non-metal-doped aluminum material is Al—Si, the non-metal-doped aluminum material may comprise less than 1.5 weight percent of silicon in Al—Si.

In some embodiments, the non-metal-doped aluminum layer 904 is formed on the metal-doped aluminum layer 902. In further embodiments, a process for forming the non-metal-doped aluminum layer 904 comprises depositing the non-metal-doped aluminum layer 904 on the metal-doped aluminum layer 902. The non-metal-doped aluminum layer 904 may be deposited by, for example, sputtering, thermal evaporation, CVD, PVD, ALD, some other deposition process, or a combination of the foregoing.

For example, in embodiments in which the non-metal-doped aluminum material of the non-metal-doped aluminum layer 904 is Al—Si, the non-metal-doped aluminum layer 904 may be formed by a sputtering process that utilizes an Al—Si target in a processing chamber, such that the sputtering process deposits a layer of Al—Si on the metal-doped aluminum layer 902. In embodiments in which the non-metal-doped aluminum material of the non-metal-doped aluminum layer 904 is Al-doped ZnO, the non-metal-doped aluminum layer 904 may be formed by a thermal evaporation process that evaporates a compound of aluminum-zinc in a processing chamber and pumps oxygen into the processing chamber as the aluminum-zinc compound is evaporated, such that the thermal evaporation process deposits a layer of Al-doped ZnO on the metal-doped aluminum layer 902. In embodiments in which the non-metal-doped aluminum material of the non-metal-doped aluminum layer 904 is Al-doped DLC, the non-metal-doped aluminum layer 904 may be formed by a hybrid CVD-sputtering process. The hybrid CVD-sputtering process may utilize an aluminum target in a processing chamber and pump a precursor comprising carbon (e.g., acetylene ($C_2H_2$)) into the processing chamber as the aluminum target is sputtered, such that the hybrid CVD-sputtering process deposits a layer of Al-doped DLC on the metal-doped aluminum layer 902.

Figure 10:
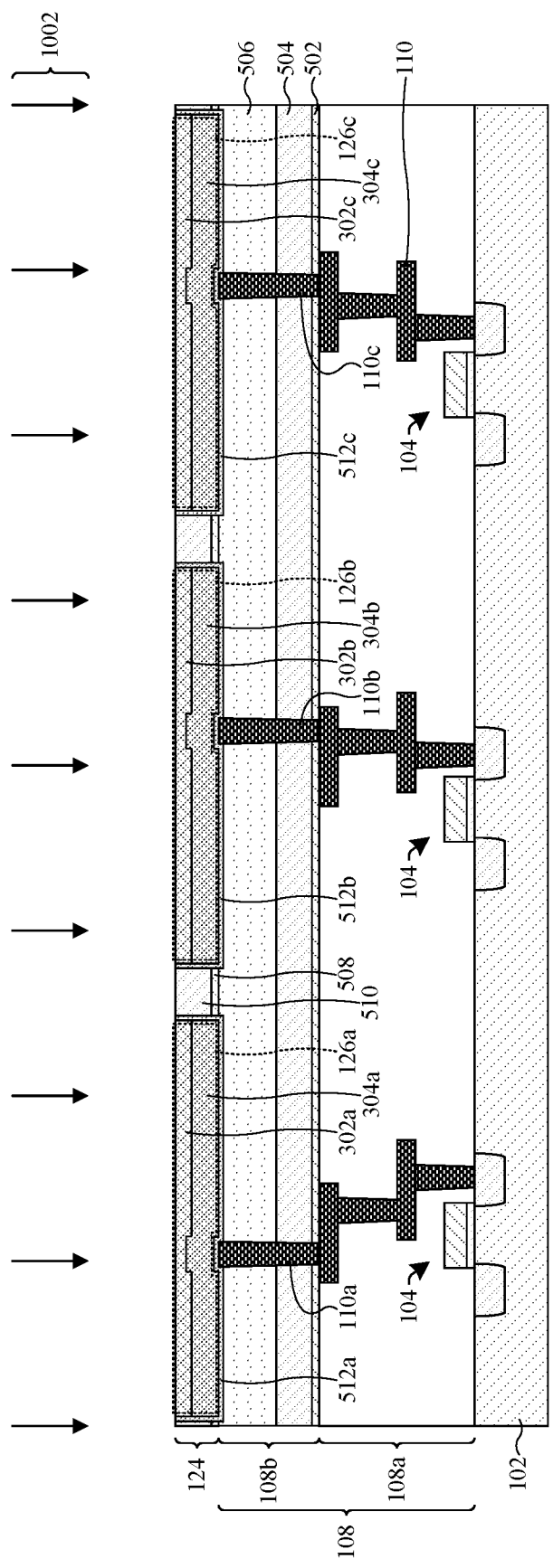

As shown in FIG. 10, a plurality of conductive reflectors 126a-c are formed over the ILD structure 108 and in the second dielectric grid 124. Further, a first plurality of barrier structures 512a-c are formed between the ILD structure 108 and the plurality of conductive reflectors 126a-c, respectively. In some embodiments, the plurality of conductive reflectors 126a-c comprise metal-doped aluminum structures 304a-c, respectively. Further, the plurality of conductive reflectors 126a-c comprise non-metal-doped aluminum structures 302a-c, respectively. The non-metal-doped aluminum structures 302a-c are disposed over the metal-doped aluminum structures 304a-c, respectively.

In some embodiments, a process for forming the conductive reflectors 126a-c and the first plurality of barrier structures 512a-c comprises performing a planarization process 1002 (e.g., CMP) into the non-metal-doped aluminum layer 904, the metal-doped aluminum layer 902, and the barrier layer 802 (see, e.g., FIG. 9). The planarization process 1002 removes upper portions of the non-metal-doped aluminum layer 904, thereby leaving lower portions of the non-metal-doped aluminum layer 904 in place as the non-metal-doped aluminum structures 302a-c; removes upper portions of the metal-doped aluminum layer 902, thereby leaving lower portions of the metal-doped aluminum layer 902 in place as the metal-doped aluminum structures 304a-c; and removes upper portions of the barrier layer 802, thereby leaving lower portions of the barrier layer 802 in place as the first plurality of barrier structures 512a-c. The planarization process 1002 planarizes upper surfaces of the non-metal-doped aluminum structures 302a-c, upper surfaces of the metal-doped aluminum structures 304a-c, and upper surfaces of the first plurality of barrier structures 512a-c. In further embodiments, the planarization process 1002 may be performed into the second dielectric grid 124 to remove an upper portion of the second dielectric grid 124. In such embodiments, the planarization process 1002 planarizes the upper surfaces of the non-metal-doped aluminum structures 302a-c, the upper surfaces of the metal-doped aluminum structures 304a-c, the upper surfaces of the first plurality of barrier structures 512a-c, and upper surfaces of the second dielectric grid 124.

Figure 11:
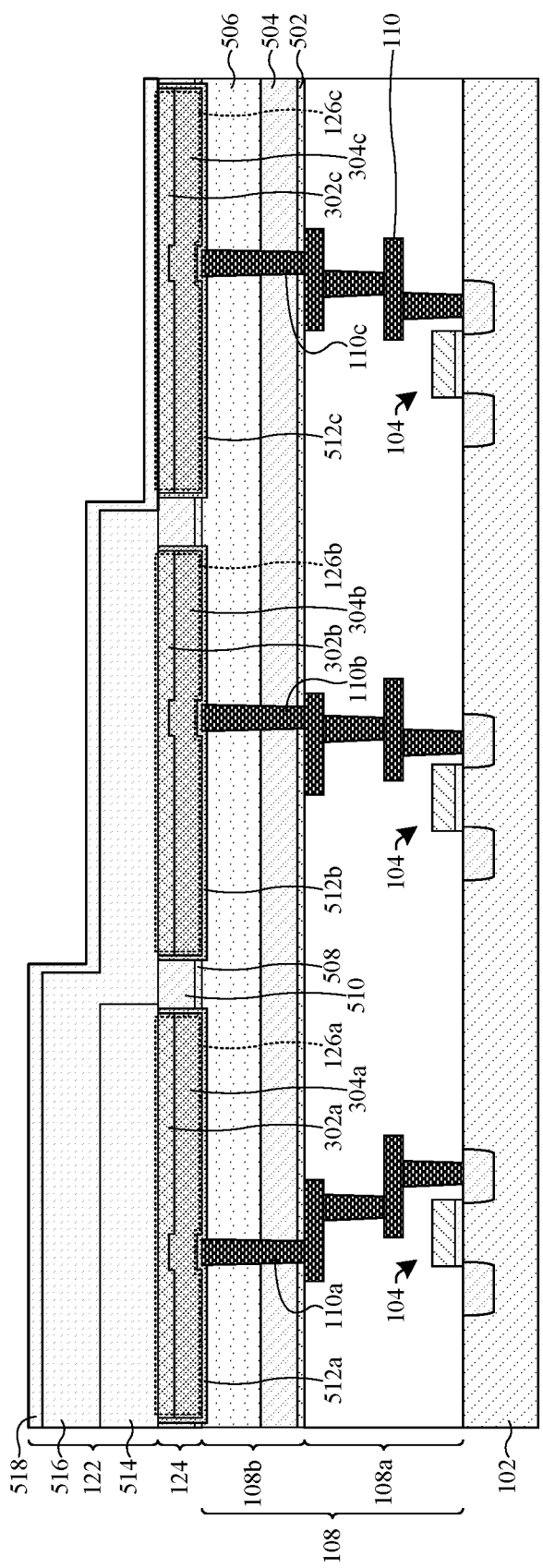

As shown in FIG. 11, an isolation structure 122 is formed over the plurality of conductive reflectors 126a-c and the second dielectric grid 124. The isolation structure 122 comprises a sixth dielectric structure 514, a seventh dielectric structure 516, and an eighth dielectric structure 518.

In some embodiments, a process for forming the isolation structure 122 comprises depositing a sixth dielectric layer (not shown) on the conductive reflectors 126a-c, the second dielectric grid 124, and the first plurality of barrier structures 512a-c. In further embodiments, the sixth dielectric layer may be deposited by, for example, CVD, low temperature CVD (e.g., having a processing temperature less than or equal to about 250° C.), PVD, ALD, or the like. A first patterned masking layer (not shown) is then formed on the sixth dielectric layer. Thereafter, the sixth dielectric layer is exposed to an etchant to remove unmasked portions of the sixth dielectric layer, thereby forming the sixth dielectric structure 514. In further embodiments, the sixth dielectric structure 514 is formed on the first conductive reflector 126a, the first barrier structure 512a, and a first portion of the second dielectric grid 124.

Further, a seventh dielectric layer (not shown) is deposited over the sixth dielectric structure 514, the conductive reflectors 126a-c, the second dielectric grid 124, and the first plurality of barrier structures 512a-c. In some embodiments, the seventh dielectric layer may be deposited by, for example, CVD, PVD, ALD, or the like. A second patterned masking layer (not shown) is then formed on the seventh dielectric layer. Thereafter, the seventh dielectric layer is exposed to an etchant to remove unmasked portions of seventh dielectric layer, thereby forming the seventh dielectric structure 516. In further embodiments, the seventh dielectric structure 516 is formed on the sixth dielectric structure 514, the second conductive reflector 126b, the second barrier structure 512b, and a second portion of the second dielectric grid 124.

Further, the eighth dielectric structure 518 is formed over the sixth dielectric structure 514, the seventh dielectric structure 516, the conductive reflectors 126a-c, the second dielectric grid 124, and the first plurality of barrier structures 512a-c. In some embodiments, the eighth dielectric structure 518 is formed on the sixth dielectric structure 514, the seventh dielectric structure 516, the third conductive reflector 126c, the second dielectric grid 124, and the third barrier structure 512c. In further embodiments, the eighth dielectric structure 518 may be deposited by, for example, CVD, PVD, ALD, or the like. In further embodiments, the sixth dielectric layer, the seventh dielectric layer, and/or the eighth dielectric structure 518 may comprise, for example, an oxide (e.g., $SiO_2$), a nitride (e.g., SiN), an oxy-nitride (e.g., $SiO_XN_Y$), or the like. In yet further embodiments, the sixth dielectric layer, the seventh dielectric layer, and the eighth dielectric structure 518 comprise an oxide (e.g., $SiO_2$).

It will be appreciated that, in some embodiments, one or more additional processing fluids (e.g., etch residue removers, photoresist strippers, deionized water, etc.) may be used to form the isolation structure 122. For example, after the sixth dielectric structure 514 and/or the seventh dielectric structure 516 is formed, one or more of the conductive reflectors 126a-c may be exposed to a photoresist stripper. In some embodiments, the one or more additional processing fluids may have a pH greater than 9. The one or more additional processing fluids may have a pH greater than 10. In further embodiments, the one or more of the additional processing fluids may have a pH of about 10.7. In yet further embodiments, the one or more additional processing fluids may have a water content greater than 20 percent. In yet further embodiments, the one or more additional processing fluids may comprise fluorine (F).

Because the non-metal-doped aluminum structures 302a-c cover the metal-doped aluminum structures 304a-c, respectively, the non-metal-doped aluminum structures 302a-c may prevent galvanic corrosion of the metal-doped aluminum structures 304a-c by the etchant(s) and/or the one or more additional processing fluids (e.g., due to the non-metal-doped aluminum material being resistant to galvanic corrosion). Because the non-metal-doped aluminum structures 302a-c protect the metal-doped aluminum structures 304a-c from galvanic corrosion, the isolation structure 122 may be formed without the conductive reflectors 126a-c pitting. Because the conductive reflectors 126a-c may not be pitted, the conductive reflectors 126a-c may have improved reflectivity over other conductive reflectors not comprising the non-metal-doped aluminum material.

Figure 12:
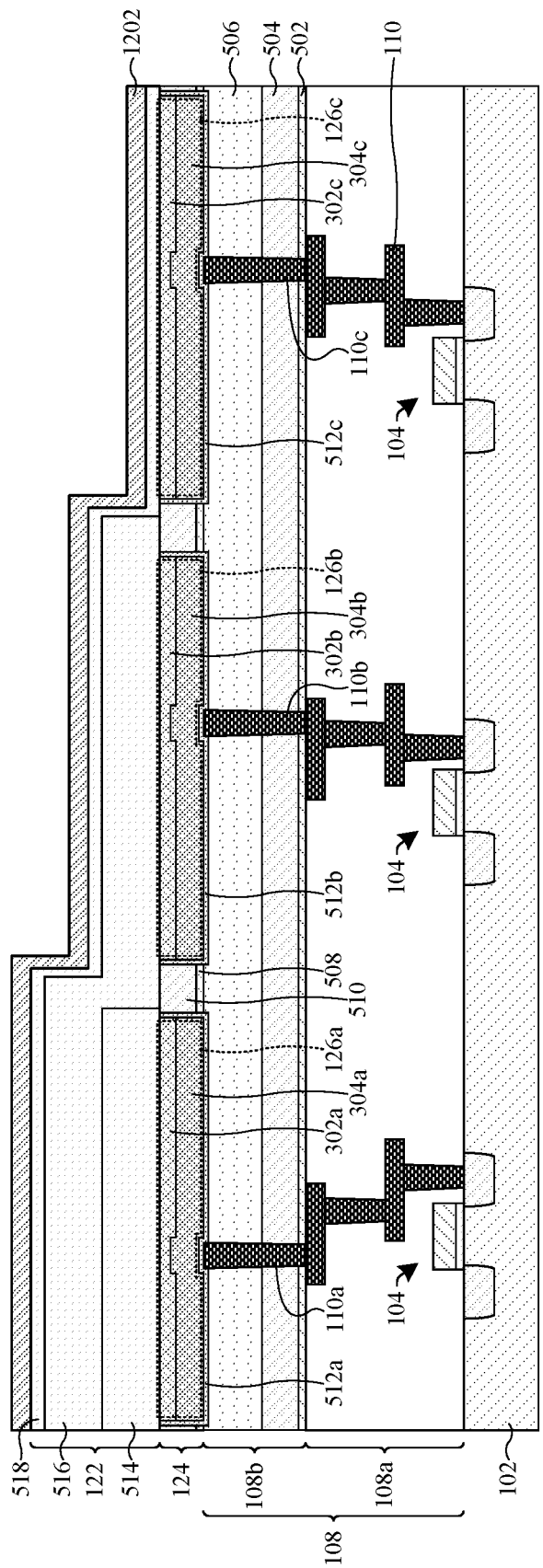

As shown in FIG. 12, a barrier layer 1202 is formed over the isolation structure 122. In some embodiments, a process for forming the barrier layer 1202 comprises depositing the barrier layer 1202 on the eighth dielectric structure 518. In further embodiments, the barrier layer 1202 may be formed by, for example, CVD, PVD, ALD, or the like. In yet further embodiments, the barrier layer 1202 may comprise, for example, TiN, WC, or the like.

Figure 13:
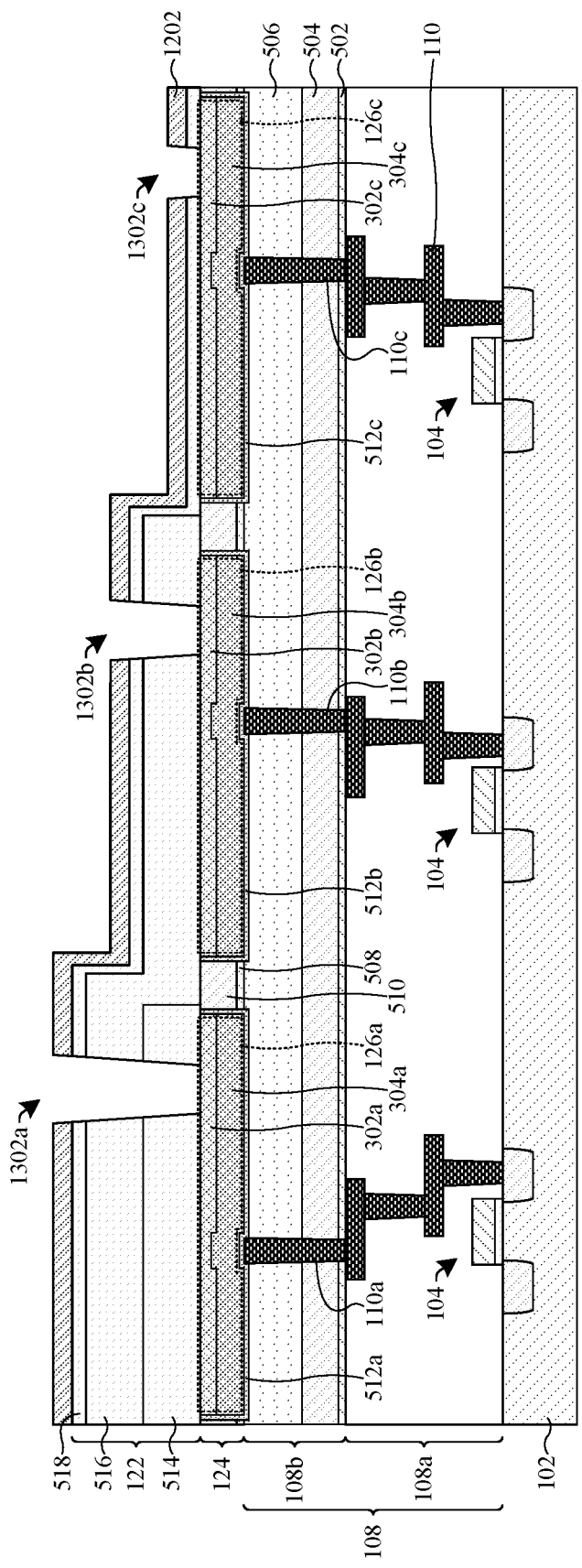

As shown in FIG. 13, a plurality of via openings 1302a-c are formed over the conductive reflectors 126a-c and the second dielectric grid 124. The via openings 1302a-c extend through the isolation structure 122 and the barrier layer 1202 to the conductive reflectors 126a-c, respectively. For example, a first via opening 1302a extends through the isolation structure 122 and the barrier layer 1202 to the first conductive reflector 126a, a second via opening 1302b extends through the isolation structure 122 and the barrier layer 1202 to the second conductive reflector 126b, and a third via opening 1302c extends through the isolation structure 122 and the barrier layer 1202 to the third conductive reflector 126c. In some embodiments, the via openings 1302a-c have angled sidewalls. In further embodiments, a process for forming the via openings 1302a-c comprises forming a patterned masking layer (not shown) on the barrier layer 1202. Thereafter, the barrier layer 1202, the eighth dielectric structure 518, the seventh dielectric structure 516, and the sixth dielectric structure 514 are exposed to an etchant to remove unmasked portions of the barrier layer 1202, the eighth dielectric structure 518, the seventh dielectric structure 516, and the sixth dielectric structure 514, thereby forming the via openings 1302a-c.

It will be appreciated that, in some embodiments, one or more additional processing fluids (e.g., etch residue removers, photoresist strippers, deionized water, etc.) may be used to form the via openings 1302a-c. The one or more additional processing fluids used to form the via openings 1302a-c may be similar to the one or more additional processing fluids used to form the isolation structure 122. Because the non-metal-doped aluminum structures 302a-c cover the metal-doped aluminum structures 304a-c, respectively, the via openings 1302a-c may be formed without the conductive reflectors 126a-c pitting (e.g., due to the non-metal-doped aluminum material being resistant to galvanic corrosion). Because the conductive reflectors 126a-c may not be pitted, the conductive reflectors 126a-c may have improved reflectivity over other conductive reflectors not comprising the non-metal-doped aluminum material.

Figure 14:
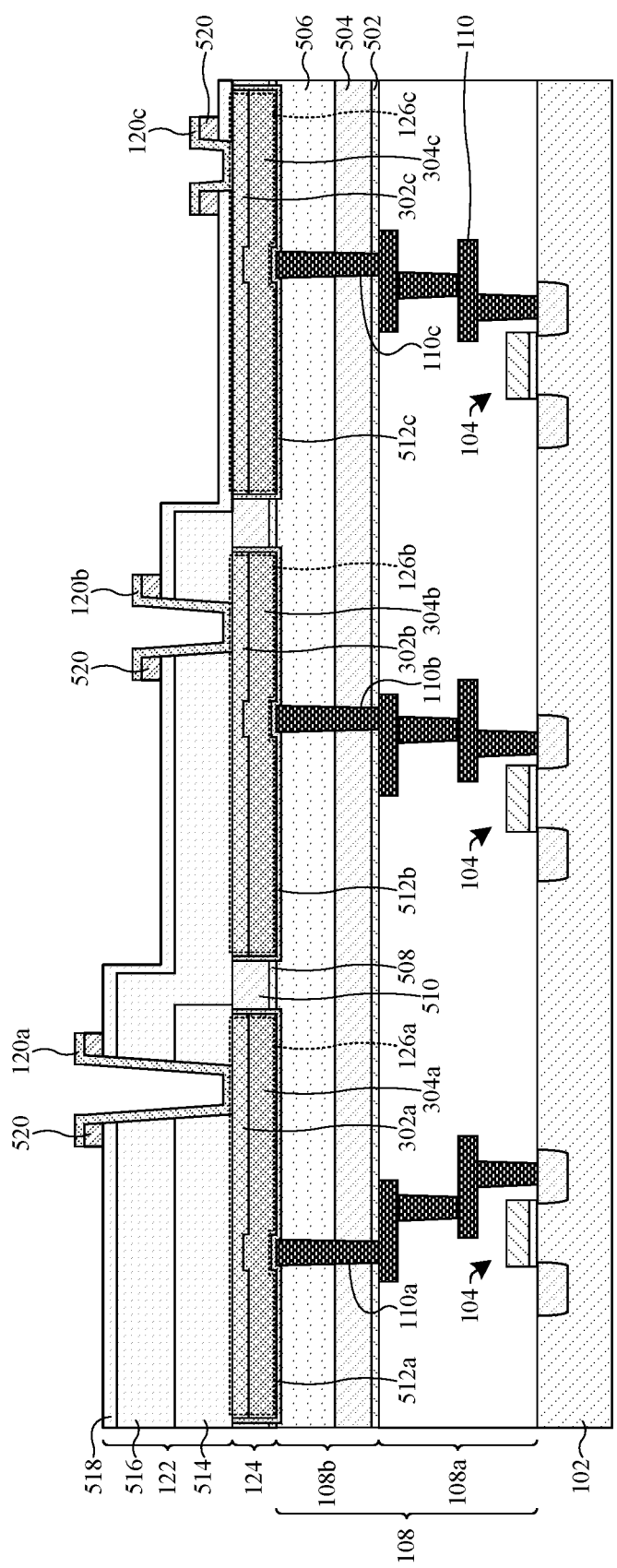

As shown in FIG. 14, a plurality of via structures 120a-c are formed over the conductive reflectors 126a-c, respectively, and at least partially over the isolation structure 122. The plurality of via structures 120a-c are electrically coupled to the conductive reflectors 126a-c, respectively. Further, a second plurality of barrier structures 520 are formed over the isolation structure 122. In some embodiments, the second plurality of barrier structures 520 separate an upper surface of the eighth dielectric structure 518 from lower surfaces of the via structures 120a-c.

In some embodiments, a process for forming the via structures 120a-c and the second plurality of barrier structures 520 comprises depositing a conductive via layer (not shown) on the barrier layer 1202 (see, e.g., FIG. 12) and lining the plurality of via openings 1302a-c (see, e.g., FIG. 13). The conductive via layer may be deposited by, for example, sputtering, CVD, PVD, ALD, or the like. A patterned masking layer (not shown) is then formed on the conductive via layer. Thereafter, the conductive via layer and the barrier layer 1202 is exposed to an etchant to remove unmasked portions of the conductive via layer and the barrier layer, thereby forming the via structures 120a-c and the second plurality of barrier structures 520.

Figure 15:
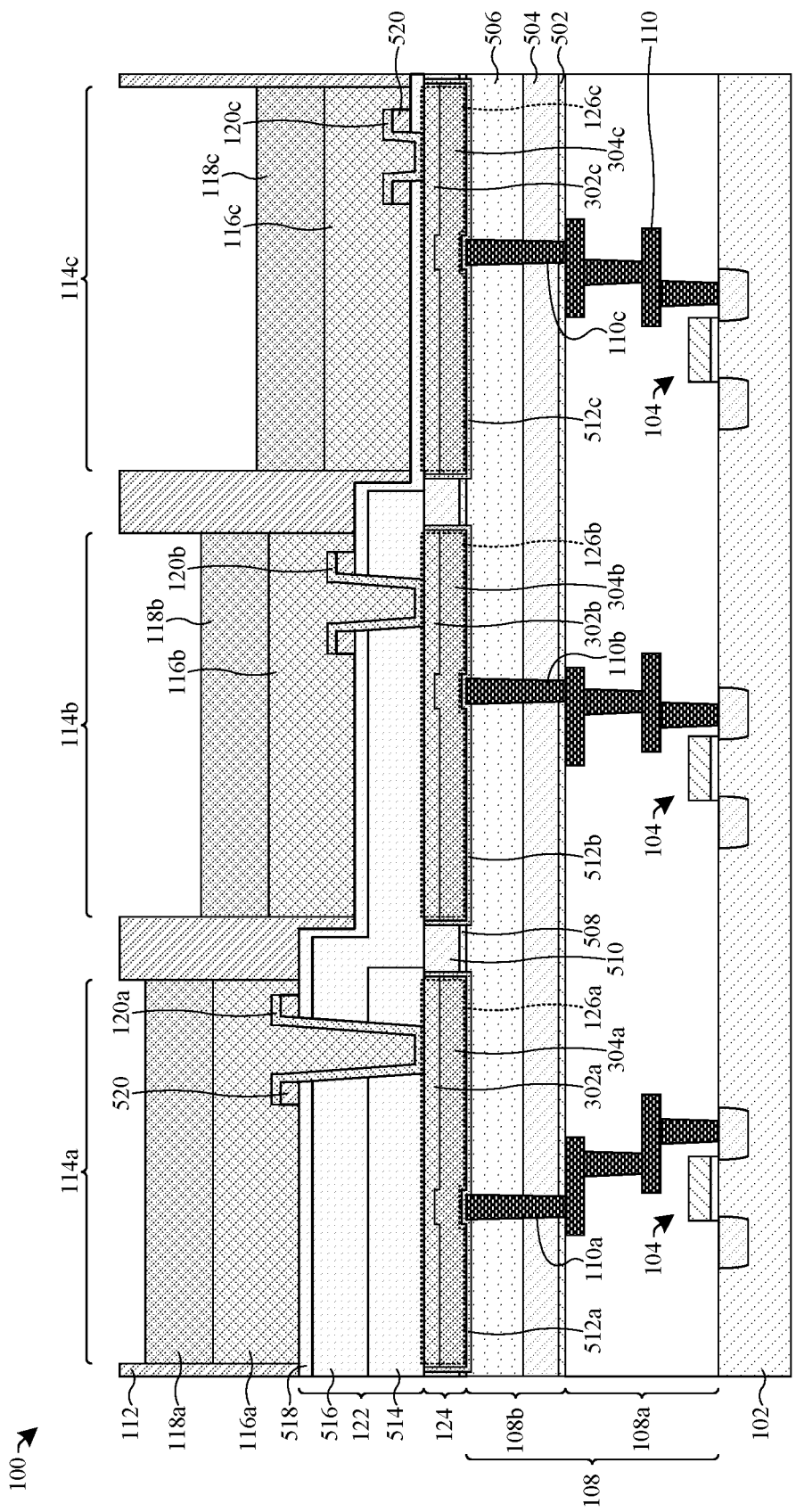

As shown in FIG. 15, a first dielectric grid 112 is formed over the isolation structure 122 and at least partially over the via structures 120a-c. In some embodiments, the first dielectric grid 112 is formed on the isolation structure 122. In further embodiments, a process for forming the first dielectric grid 112 comprises depositing a dielectric layer on the eighth dielectric structure 518. The dielectric layer may be deposited by, for example, CVD, PVD, ALD, or the like. A patterned masking layer (not shown) is then formed on the dielectric layer. Thereafter, the dielectric layer is exposed to an etchant to remove unmasked portions of the dielectric layer, thereby forming the first dielectric grid 112.

Also shown in FIG. 15, a plurality of electrodes 116a-c are formed over the via structures 120a-c, at least partially over the isolation structure 122, and in the first dielectric grid 112. In some embodiments, a process for forming the electrodes 116a-c comprises depositing a conductive material (e.g., ITO) on the isolation structure 122, on the via structures 120a-c, and on the first dielectric grid 112. The conductive material may be deposited by, for example, sputtering, CVD, PVD, ALD, or the like. The conductive material may be such that light (e.g., visible light) can pass through the conductive material (e.g., due to a thickness of the conductive material, a chemical composition of the conductive material, etc.). A patterned masking layer (not shown) is then formed on the conductive material. Thereafter, the conductive material is exposed to an etchant to remove unmasked portions of the conductive material, thereby forming the electrodes 116a-c.

Also shown in FIG. 15, a plurality of light-emitting structures 118a-c are formed in the first dielectric grid 112 and over the plurality of electrodes 116a-c, respectively. In some embodiments, a process for forming the light-emitting structures 118a-c comprises depositing a light-emitting layer (e.g., an organic, light-emitting layer) on the plurality of electrodes 116a-c. In further embodiments, the light-emitting layer is deposited on the plurality of electrodes 116a-c and the first dielectric grid 112. The light-emitting layer may be deposited by, for example, PVD, thermal vacuum evaporation, ink-jet printing, spin-coating, or the like. A patterned masking layer (not shown) is then formed on the light-emitting layer. Thereafter, the light-emitting layer is exposed to an etchant to remove unmasked portions of the light-emitting layer, thereby forming the light-emitting structures 118a-c. It will be appreciated that, in some embodiments, the light-emitting structures 118a-c may be deposited or grown by other deposition/growth processes (e.g., a deposition/growth process that forms the light-emitting structures 118a-c without forming a patterned masking layer on a light-emitting layer). In further embodiments, after the light-emitting structures 118a-c are formed, formation of a plurality of pixel regions 114a-c may be complete. In yet further embodiments, after the light-emitting structures 118a-c are formed, formation of the display device 100 may be complete.

Figure 16:
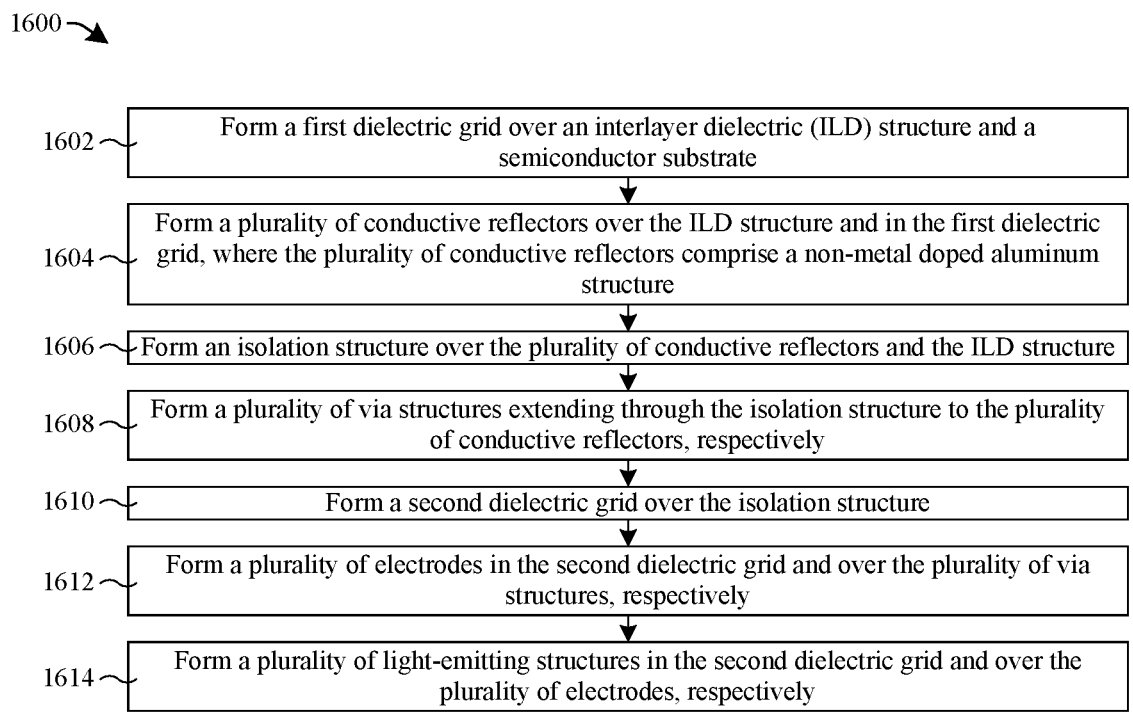
FIG. 16 illustrates a flowchart of some embodiments of a method for forming a display device having a conductive reflector with improved reflectivity.

FIG. 16 illustrates a flowchart of some embodiments of a method for forming a display device having a conductive reflector with improved reflectivity. While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1602, a first dielectric grid is formed over an interlayer dielectric (ILD) structure and a semiconductor substrate. FIGS. 6-7 illustrate a series of cross-sectional views of some embodiments corresponding to act 1602.

At act 1604, a plurality of conductive reflectors are formed over the ILD structure and in the first dielectric grid, where the plurality of conductive reflectors comprise a non-metal-doped aluminum structure. FIGS. 8-10 illustrate a series of cross-sectional views of some embodiments corresponding to act 1604.

At act 1606, an isolation structure is formed over the plurality of conductive reflectors and the ILD structure. FIG. 11 illustrates a cross-sectional view of some embodiments corresponding to act 1606.

At act 1608, a plurality of via structures are formed extending through the isolation structure to the plurality of conductive reflectors, respectively. FIGS. 12-14 illustrate a series of cross-sectional views of some embodiments corresponding to act 1608.

At act 1610, a second dielectric grid is formed over the isolation structure. FIG. 15 illustrates a cross-sectional view of some embodiments corresponding to act 1610.

At act 1612, a plurality of electrodes are formed in the second dielectric grid and over the plurality of via structures, respectively. FIG. 15 illustrates a cross-sectional view of some embodiments corresponding to act 1612.

At act 1614, a plurality of light-emitting structures are formed in the second dielectric grid and over the plurality of electrodes, respectively. FIG. 15 illustrates a cross-sectional view of some embodiments corresponding to act 1614.

In some embodiments, the present application provides a display device. The display device comprises an isolation structure disposed over a semiconductor substrate. An electrode is disposed at least partially over the isolation structure. A light-emitting structure is disposed over the electrode. A conductive reflector is disposed below the isolation structure and electrically coupled to the electrode, wherein the conductive reflector is disposed at least partially between sidewalls of the light-emitting structure, and wherein the conductive reflector comprises a non-metal-doped aluminum material.

In some embodiments, the present application provides a display device. The display device comprises an interconnect structure disposed over a semiconductor substrate. An isolation structure is disposed over the interconnect structure and the semiconductor substrate. An electrode is disposed at least partially over the isolation structure, wherein the electrode extends into the isolation structure toward the interconnect structure. A light-emitting structure is disposed over the electrode and at least partially between sidewalls of the electrode. A conductive reflector is disposed between the interconnect structure and the isolation structure, wherein: the conductive reflector is electrically coupled to the interconnect structure and the electrode; the conductive reflector comprises a metal-doped aluminum structure comprising a metal-doped aluminum material; the conductive reflector comprises a non-metal-doped aluminum structure comprising a non-metal-doped aluminum material; and the non-metal-doped aluminum structure is disposed over the metal-doped aluminum structure.

In some embodiments, the present application provides a method for forming a display device. The method comprises receiving a workpiece comprising a semiconductor substrate, an interconnect structure disposed over the semiconductor substrate, and a first dielectric layer disposed over the interconnect structure and the semiconductor substrate. A first opening is formed in the first dielectric layer, wherein the first opening exposes a portion of the interconnect structure. A non-metal-doped aluminum layer is formed over the first dielectric layer and in the first opening. An upper portion of the non-metal-doped aluminum layer is removed, such that an upper surface of a lower portion of the non-metal-doped aluminum layer is substantially aligned with an upper surface of the first dielectric layer. A second dielectric layer is formed over the first dielectric layer and the lower portion of the non-metal-doped aluminum layer. A second opening is formed in the second dielectric layer. An electrode is formed over the second dielectric layer and in the second opening, wherein the electrode is electrically coupled to the lower portion of the non-metal-doped aluminum layer. A light-emitting structure is formed over the electrode and at least partially between sidewalls of the lower portion of the non-metal-doped aluminum layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
an isolation structure disposed over a semiconductor substrate;
an electrode disposed at least partially over the isolation structure;
a light-emitting structure disposed over the electrode; and
a conductive reflector disposed below the isolation structure and electrically coupled to the electrode, wherein the conductive reflector is disposed at least partially between sidewalls of the light-emitting structure, wherein the conductive reflector comprises a non-metal-doped aluminum material, wherein the non-metal-doped aluminum material is aluminum-silicon, and wherein the non-metal-doped aluminum material comprises less than 1.5 weight percent of silicon in aluminum-silicon.

2. The display device of claim 1, wherein visible light can pass through the electrode.

3. The display device of claim 1, further comprising:
a dielectric grid disposed vertically between the isolation structure and the semiconductor substrate, wherein the conductive reflector is embedded in the dielectric grid.

4. The display device of claim 3, wherein an upper surface of the conductive reflector is co-planar with an upper surface of the dielectric grid.

5. The display device of claim 1, wherein:
the sidewalls of the light-emitting structure are opposite one another; and
the sidewalls of the light-emitting structure are disposed laterally between opposite sidewalls of the conductive reflector.

6. The display device of claim 5, wherein:
opposite sidewalls of the electrode are disposed laterally between the opposite sidewalls of the conductive reflector.

7. The display device of claim 6, wherein:
the opposite sidewalls of the electrode are substantially aligned with the sidewalls of the light-emitting structure, respectively.

8. The display device of claim 1, wherein a portion of the isolation structure is disposed directly between a lower surface of the electrode and an upper surface of the conductive reflector.

9. A display device, comprising:
an interconnect structure disposed over a semiconductor substrate;
an isolation structure disposed over the interconnect structure and the semiconductor substrate;
an electrode disposed at least partially over the isolation structure, wherein the electrode extends into the isolation structure toward the interconnect structure;
a light-emitting structure disposed over the electrode and at least partially between sidewalls of the electrode; and
a conductive reflector disposed between the interconnect structure and the isolation structure, wherein:
the conductive reflector is electrically coupled to the interconnect structure and the electrode;
the conductive reflector comprises a metal-doped aluminum structure comprising a metal-doped aluminum material;
the conductive reflector comprises a non-metal-doped aluminum structure comprising a non-metal-doped aluminum material;
the non-metal-doped aluminum structure is disposed over the metal-doped aluminum structure; and
the non-metal-doped aluminum material comprises aluminum-silicon and the metal-doped aluminum material comprises aluminum-copper.

10. The display device of claim 9, wherein:
the non-metal-doped aluminum material comprises less than 1.5 weight percent of silicon; and
the metal-doped aluminum material comprises less than 0.5 weight percent of copper.

11. The display device of claim 10, wherein:
the non-metal-doped aluminum structure has a first thickness;
the metal-doped aluminum structure has a second thickness; and
the second thickness is at least four times greater than the first thickness.

12. The display device of claim 9, wherein the metal-doped aluminum structure is disposed between the interconnect structure and the non-metal-doped aluminum structure.

13. The display device of claim 12, wherein:
the non-metal-doped aluminum structure contacts the metal-doped aluminum structure; and
the metal-doped aluminum structure contacts the non-metal-doped aluminum structure and the interconnect structure.

14. The display device of claim 13, wherein the conductive reflector is at least partially disposed between sidewalls of the light-emitting structure.

15. The display device of claim 9, wherein visible light can pass through the electrode.

16. A method for forming a display device, the method comprising:
receiving a workpiece comprising a semiconductor substrate, an interconnect structure disposed over the semiconductor substrate, and a first dielectric layer disposed over the interconnect structure and the semiconductor substrate;
forming a first opening in the first dielectric layer, wherein the first opening exposes a portion of the interconnect structure;
forming a non-metal-doped aluminum layer over the first dielectric layer and in the first opening;
removing an upper portion of the non-metal-doped aluminum layer, such that an upper surface of a lower portion of the non-metal-doped aluminum layer is substantially co-planar with an upper surface of the first dielectric layer;

forming a second dielectric layer over the first dielectric layer and the lower portion of the non-metal-doped aluminum layer;

forming a second opening in the second dielectric layer;

forming an electrode over the second dielectric layer and in the second opening, wherein the electrode is electrically coupled to the lower portion of the non-metal-doped aluminum layer; and forming a light-emitting structure over the electrode and at least partially between sidewalls of the lower portion of the non-metal-doped aluminum layer.

17. The method of claim 16, further comprising:

before the non-metal-doped aluminum layer is formed, forming a metal-doped aluminum layer over the first dielectric layer and in the first opening, wherein the non-metal-doped aluminum layer is formed on the metal-doped aluminum layer; and removing both the upper portion of the non-metal-doped aluminum layer and an upper portion of the metal-doped aluminum layer, such that a lower portion of the metal-doped aluminum layer is disposed between the lower portion of the non-metal-doped aluminum layer and the interconnect structure.

18. The method of claim 17, wherein:

the non-metal-doped aluminum layer is aluminum-silicon; and the metal-doped aluminum layer is aluminum-copper.

19. The method of claim 16, wherein the non-metal-doped aluminum layer is aluminum-silicon.

20. The method of claim 19, wherein the non-metal-doped aluminum layer comprises less than 1.5 weight percent of silicon in aluminum-silicon.

* * * * *